United States Patent
Weston

(10) Patent No.: US 11,222,156 B2
(45) Date of Patent: Jan. 11, 2022

(54) METHODS AND SYSTEMS FOR FACILITATING DESIGNING A PROGRAMMABLE LOGIC DEVICE

(71) Applicant: Clarence Yandell Weston, Elkridge, MD (US)

(72) Inventor: Clarence Yandell Weston, Elkridge, MD (US)

( * ) Notice: Subject to any disclaimer, the term of this patent is extended or adjusted under 35 U.S.C. 154(b) by 0 days.

(21) Appl. No.: 17/035,326

(22) Filed: Sep. 28, 2020

(65) Prior Publication Data

US 2021/0097223 A1 Apr. 1, 2021

Related U.S. Application Data

(60) Provisional application No. 62/906,570, filed on Sep. 26, 2019.

(51) Int. Cl.

| | |
|---|---|
| *G06F 30/343* | (2020.01) |
| *G06F 30/327* | (2020.01) |
| *G06F 30/3308* | (2020.01) |
| *G06F 30/347* | (2020.01) |
| *G06F 30/392* | (2020.01) |
| *G06Q 30/06* | (2012.01) |

(52) U.S. Cl.
CPC .......... *G06F 30/343* (2020.01); *G06F 30/327* (2020.01); *G06F 30/3308* (2020.01); *G06F 30/347* (2020.01); *G06F 30/392* (2020.01); *G06Q 30/0621* (2013.01)

(58) Field of Classification Search
CPC .. G06F 30/343; G06F 30/327; G06F 30/3308; G06F 30/347; G06F 30/392; G06Q 30/0621

USPC .......... 716/117, 116, 121, 128, 104; 703/14
See application file for complete search history.

(56) References Cited

U.S. PATENT DOCUMENTS

| | | | |
|---|---|---|---|
| 6,907,599 B1 * | 6/2005 | Kashai ....................... | G06F 8/51 717/137 |
| 10,001,943 B2 * | 6/2018 | Parra ....................... | G06F 3/0673 |
| 2004/0045015 A1 * | 3/2004 | Haji-Aghajani ........ | G06F 30/34 719/328 |
| 2013/0124891 A1 * | 5/2013 | Donaldson .............. | G06F 1/324 713/322 |
| 2017/0083586 A1 * | 3/2017 | Huang ................ | G06F 3/04886 |

(Continued)

*Primary Examiner* — Phallaka Kik

(57) ABSTRACT

Disclosed herein is a method of designing a programmable logic device (PLD), in accordance with some embodiments. Accordingly, the method comprises transmitting module indications corresponding to application modules to a client device. Further, the method comprises receiving Hardware Description Language (HDL) code expressing a design of a PLD from the client device. Further, the method comprises analyzing the HDL code. Further, the method comprises retrieving an application module and a framework module corresponding to an API call based on the analyzing. Further, the method comprises instantiating the framework module and the application module based on the retrieving. Further, the method comprises configuring common synchronous logic components and an interconnect infrastructure based on the API call. Further, the method comprises generating a flat framework circuit data corresponding to the PLD based on the instantiating and the configuring. Further, the method comprises transmitting the flat framework circuit data to the client device.

11 Claims, 30 Drawing Sheets

(56) References Cited

U.S. PATENT DOCUMENTS

2017/0111435 A1* 4/2017 Jacob .................. H04L 67/1097
2017/0359237 A1* 12/2017 Hao .................... H04W 12/069

* cited by examiner

FIG. 14

```
entity TEST_SM is
  generic (THIS_SM  : integer; PARAM : SM_RESOURCE_REC);
  port(
    clk              : in std_logic;
    reset            : in std_logic;
    SM_input         : in std_logic_vector(PARAM.WIDTH_INPUT-1 downto 0);
    SM_output        : out std_logic_vector(PARAM.WIDTH_OUTPUT-1 downto 0);
    SM_IO            : inout std_logic_vector(PARAM.WIDTH_INPUT_OUTPUT-1 downto 0);
    state_reg_rec    : in SRR;
    next_state_rec   : out NSR
  );
end entity TEST_SM;
```

FIG. 15

```vhdl
library ieee;
use ieee.std_logic_1164.all;
use ieee.numeric_std.all;
use ieee.Std_logic_unsigned.all;
use work.USER_DEFS_PKG.all;
use work.SM_API_PKG.all;

-----------------------Common Port Interface---------------------------------------------------------------------
-------------------------------------------------------------------------------------------------------------------
entity vga_controller is generic (THIS_SM              : integer := -1);
                              port ( clk              : in std_logic;
                                            reset            : in std_logic;
                                            sm_input         : in std_logic_vector(-1 downto 0);
                                            sm_output        : out std_logic_vector(10 downto 0);
                                            sm_io            : inout std_logic_vector(-1 downto 0);
                                            next_state_rec   : out nsr_array (0 ot 1);
                                            state_reg_rec    : in srr_array (0 to 1)

);

end entity vga_controller;
------------------------------------------------------------------------------------------------------------------- architecture arch of vga_controller is alias srr is state_reg_rec(0);
alias state_reg : integer is state_reg_rec(0).state_reg;
constant st_vga_read : integer := 0;
constant st_vga_wait : integer := 1;
signal h_video_en : std_logic;
signal h_sync : std_logic;
signal v_video_en : std_logic;
signal v_sync : std_logic;
signal video_on : std_logic;
signal sprite_bit : std_logic;

begin sm_output(7 downto 0) <= (7|6 => not sprite_bit, 5|4|3 => sprite_bit, others => '0') when (video_on = '1' else
                              (others => '0');
sm_output(9 downto 8) <= v_sync & h_sync;
sm_output(10) <= '1' when (state_reg_rec(1).counter(0).value < ms(500)) else
                              '0';
h_video_en <= '0' when (srr.counter(0).value <us(5.76) or srr.counter(0).vlaue >= us(31.36)) else
                              '1';
v_video_en <= '0' when (srr.counter(1).value < ms(0.992) or srr.counter(1).value >= ms(16.352)) else
                              '1';
video_on <= h_video_en and v_video_en;
h_sync <= '0' when (srr.counter(0).value < us(3.84)) else
                              '1';
v_sync <= '0' when (srr.counter(1).value < us(64)) else
                              '1';
sprite_bit <= reversed(srr.dataf)(state_reg_rec(1).delay.value);

process(state_reg_rec)
begin
-------------------------------------------------------------------------------------------------------------------
--------------------------------------ACTIVE RESOURCE 0 (of 1) state -1--------------------------------
DEFAULT_NEXT_STATE( SYS_CLOCK, next_state_rec, state_reg_rec );
READ_FIFO_DATA( sprite, -1, -1, next_state_rec, state_reg_rec, '0' );
CONFIGURE_COUNTER( 0, us(32) -1, -1, next_state_rec, state_reg_rec );
CONFIGURE_COUNTER( 1, ms(16.672) -1, -1, next_state_rec, state_reg_rec );

CONFIGURE_COUNTER( 0, s(1), -1, next_state_rec(1), state_reg_rec(1) );
ACTION( rollover_count, 32, us(0.8), next_state_rec(1), state_reg_rec(1), h_video_en = '1' );
-------------------------------------------------------------------------------------------------------------------

SM0: case (state_reg) is
              when st_vga_read =>
                            READ_FIFO_DATA( sprite, 1, 1, next_state_rec, state_reg_rec, srr.fifo_read_ready );
              when st_vga_wait =>
                            ACTION( transition, 0, ms(1.042) -4, 1 next_state_rec, state_reg_rec );
end case;

end process;

end architecture arch;
```

FIG. 16

```vhdl
library ieee;
use ieee.std_logic_1164.all;
use ieee.numeric_std.all;
use ieee.std_logic_unsigned.all;
use work.USER_DEFS_PKG.all;
use work.SM_API_PKG.all;

------------------------Common Port Interface------------------------
-------------------------------------------------------------------- entity sprite is generic (THIS_SM        : integer := -1);
        port (
                clk             : in std_logic;
                reset           : in std_logic;
                sm_input        : in std_logic_vector(-1 downto 0);
                sm_output       : out std_logic_vector(-1 downto 0);
                sm_io           : inout std_logic_vector(-1 downto 0);
                next_state_rec  : out nsr_array (0 to 0);
                state_reg_rec   : in srr_array (0 to 0)

);

end entity sprite;
----------------------------------------------------------------------- architecture arch of sprite is alias srr is state_reg_rec(0);
alias state)reg : integer is state_reg_rec(0).state_reg;
constant hello_world : std_logic_vector_array := (
"10001001111100100000100000111111",
"10001001000000100000100000100001",
"10001001000000100000100000100001",
"11111001111100100000100000100001",
"10001001000000100000100000100001",
"10001001000000100000100000100001",
"10001001111100111100111100111111",
"00000000000000000000000000000000",
"10000010111100111110010000111110",
"10000010111100111110010000111110",
"10010010100100100010010000100001",
"10101010100100111100010000100001",
"10101010100100100010010000100001",
"11000110100100100010010000100001",
"10000010111100100010011110111110",
"00000000000000000000000000000000"
);

begin process(state_reg_rec)
begin

---------------------------------------------------------
------------------------ACTIVE_RESOURCE 0 (of 0) state -1------------------------
DEFAULT_NEXT_STATE( SYS_CLOCK, next_state_rec, state_reg_rec );
---------------------------------------------------------
WRITE_FIFO_DATA( vga_congtroller, hello_world, srr.fifo_write_ready, 16, state_reg_rec(0).state_reg, next_state_rec, state_reg_rec );
---------------------------------------------------------
--------------------------------------------------------- end process;

end architecture arch;
```

FIG. 17

```vhdl
library ieee;
use ieee.std_logic_1164.all;
use ieee.numeric_std.all;
use ieee.std_logic_unsigned.all;
use work.USER_DEFS_PKG.all;
use work.SM_API_PKG.all;

-----------------------------Common Port Interface-----------------------------
entity vga_controller is
    generic (THIS_SM            : integer := -1);
    port (
        clk                     : in  std_logic;
        reset                   : in  std_logic;
        sm_input                : in  std_logic_vector(-1 downto 0);
        sm_output               : out std_logic_vector(10 downto 0);
        sm_io                   : inout std_logic_vector(-1 downto 0);
        next_state_rec          : out nsr_array (0 to 1);
        state_reg_rec           : in  srr_array (0 to 1)
    );
end entity vga_controller;
-------------------------------------------------------------------------------
architecture arch of vga_controller is
```

FIG. 26

```
CONNECT_CONTROL_CHANNEL(0, "0000", next_state_rec, state_reg_rec);
CONFIGURE_COUNTER({_ARRAY_INDEX_PARAM_INDEX}, 1024, -1, next_state_reg, state_reg_rec);
READ_FIFO_DATA(this_sm, 1024, -1, next_state_rec, state_reg_rec, SRR.fifo_read_ready);
READ_FWFT_DATA(this_sm, 1024, -1, next_state_rec, state_reg_rec);
WRITE_FIFO_DATA (this_sm, "110101", SRR.fifo_write_ready, 1024, -1, next_state_rec, state_reg_rec);
MONITOR_RISING_EDGES(0, sm_input(0), next_state_rec, state_reg, rec);
MONITOR_FALLING_EDGES(1, sm_input(0), next_state_rec, state_reg_rec);
ACTION (transition, -1, us(1), 1, next_state_rec, state_reg_rec);
ACTION (rollover_count, us(1), next_state_rec, state_reg_rec);
ACTION (register_for_event, 0, -1, next_state_rec, state_reg_rec);
ACTION (fire_event, 0, -1, next_state_rec, state_reg_rec);
ACTION (signal_fire_event, 0, sm_input(0), '1', next_state_rec, state_reg_rec);
ACTION (signal_transition, 0, sm_input(0), '1', next_state_rec, state_reg_rec);
DISABLE_FILE(next_state_rec, state_reg_rec);
RESET_COUNTER(1, next_state_rec, state_reg_rec );
RESET_ALL_COUNTERS( next_state_rec, state_reg_rec );
RESET_FIFO(-1, next_state_rec, state_reg_rec );
```

FIG. 27

```
CONNECT_CONTROL_CHANNEL(0, "0000", next_state_rec, state_reg_rec);
WRITE_FIFO_DATA(vga_controller, "110101",SRR.fifo_write_ready, 1024, -1, next_state_rec, state_reg_rec);
READ_FIFO_DATA(sprite, 1024, -1, next_state_rec, state_reg_rec, SRR.fifo_read_ready);
```

Constants defined in USER_DEFS_PKG.pkg

---------SM_ENUMERATION_DECLARATION---------

```
constant sprite : natural := 0;
constant vga_controller : natural := 1;
```

FIG. 28

```
library IEEE,
user IEEE.STD_LOGIC_1164.all;
use ieee.numeric_std.all;
package USER_DEFS_PKG is
```

----------------------------------USE_APPLICATION_CONSTANTS----------------------

```
constant SYS_CLOCK              : natural := 50000000;
constant RESET_POLARITY         : std_logic := '1';
constant NUM_STATE_MACHINES     : natural := 3;
constant NUM_EVENTS             : natural := 0;
constant NUM_CONTROL_BITS       : natural := 32;
constant NUM_SIGNAL_TRANSITIONS : integer := 0;
constant NUM_VIRTUAL_PORT_WIDTH : integer := -1;        -- one could make
```

----------------------------------SM_CLOCK_DOMAINS----------------------

```
constant NUM_CLOCK_DOMAINS      : positive := 1;
type CLOCK_ARRAY_TYPE is array (0 to NUM_CLOCK_DOMAINS -1) of natural;
constant SM_CLOCK_ARRAY : CLOCK_ARRAY_TYPE := (50000000, others => 0);
```

----------------------------------SM_ENUMERATION_DECLARATION----------------

```
constant sprite : natural := 0;
constant vga_controller : natural := 1;
```

----------------------------------FRAMEWORK AND SM COUNTER SIZE SUBTYPE DEFS----------------------

```
subtype COUNT_INTEGER is natural range 0 to 50000000;
subtype DIVIDE_INTEGER is integer range -1 to 40;
subtype DELAY_INTEGER is integer range -1 to 52096;
```

FIG. 29

```
CONNECT_CONTROL_CHANNEL(0, "0000", next_state_rec, state_reg_rec);
CONFIGURE_COUNTER({_ARRAY_INDEX_PARAM_INDEX}, 1024, -1,
next_state_rec ,state_reg_rec);
READ_FIFO_DATA(this_sm, 1024, -1, next_state_rec, state_reg_rec,
SRR.fifo_read_ready);
READ_FWFT_DATA(this_sm, 1024, -1, next_state_rec, state_reg_rec);
WRITE_FIFO_DATA (this_sm, "110101", SRR.fifo_write_ready, 1024, -1,
next_state_rec, state_reg_rec);
MONITOR_RISING_EDGES(0, sm_input(0), next_state_rec, state_reg_rec);
MONITOR_FALLING_EDGES(1, sm_input(0), next_state_rec, state_reg_rec);
ACTION (transition, -1, us(1), 1, next_state_rec, state_reg_rec);
ACTION (rollover_count, us(1), 1, next_state_rec, state_reg_rec);
ACTION (register_for_event, 0, -1, next_state_rec, state_reg_rec);
ACTION (fire_event, 0, -1, next_state_rec, state_reg_rec);
ACTION (signal_fire_event, 0, sm_input(0),'1', next_state_rec, state_reg_rec);
ACTION (signal_transition, 0, sm_input(0),'1', next_state_rec, state_reg_rec);
DISABLE_FILE(next_state_rec ,state_reg_rec);
RESET_COUNTER(1, next_state_rec, state_reg_rec );
RESET_ALL_COUNTERS( next_state_rec, state_reg_rec );
RESET_FIFO(-1, next_state_rec, state_reg_rec );
```

FIG. 30

METHODS AND SYSTEMS FOR FACILITATING DESIGNING A PROGRAMMABLE LOGIC DEVICE

The current application claims a priority to the U.S. Provisional Patent application Ser. No. 62/906,570 filed on Sep. 26, 2019. The current application is filed on Sep. 28, 2020, whereas Sep. 26, 2020 and Sep. 27, 2020 were on a weekend.

TECHNICAL FIELD

Generally, the present disclosure relates to the field of data processing. More specifically, the present disclosure relates to methods and systems for facilitating designing a programmable logic device.

BACKGROUND

The traditional approach for designing a Programmable Logic Device (PLD) or field-programmable gate array (FPGA) using a hardware description language (HDL) may require a design architecture that may be hierarchical in nature. Further, a top-level module in the hierarchical architecture of the PLD may be put together with multiple lower-level modules. Further, the multiple lower-level modules may be used as components that may perform some sub-functionality of the top-level module. Further, each lower-level module may also be hierarchical in nature. Further, the hierarchical design architecture in HDL design may use component instantiation of a lower-level module as its primary method of code reuse. Further, each sub-module of a plurality of sub-modules in the hierarchal design architecture may have a port interface describing the signals that may be exposed to the outside of each sub-module. Further, the hierarchical design architecture may allow the port interface of each sub-module to be different from another sub-module. Further, the HDL programmer that codes in the HDL may have the freedom of choosing the names and types of the signals expose at the port interface. Further, the freedom of choosing the signals that may appear at the port interface may make for an ad-hoc coding style and may negatively impact productivity, readability, maintainability, and testability. Further, the lack of a standard port interface at any level in a hierarchical design architecture may prevent easy integration, addition, removal, or testing of a lower level module due to differences in the port interface.

Newer methods for designing a PLD or FPGA may utilize High-Level Synthesis (HLS) tools or may utilize graphical programming approaches. Further, HLS tools or graphical programming approaches for designing a PLD or FPGA may require a source to source compiler for converting from a high-level language or a graphical representation to a HDL such as VHDL or Verilog. Further, HLS tools may convert source code from written in C/C++ programming language into HDL code which then can be synthesized into an FPGA. Further, graphical programming approaches may convert graphical descriptions of FPGA circuits into HDL code which then can be synthesized into an FPGA. Further, HLS tools or graphical approaches to designing an FPGA that utilize source to source compilers may be vendor-specific. Further, HLS tools or graphical approaches to designing FPGA from one vendor may not have the ability to target other vendor's FPGA devices. Further, HLS or graphical programming approaches may not have the ability to generate HDL code that can target older FPGA devices that were in use before the tool was created. Further, the source code for the HLS tool or graphical approach source code is not written in a native HDL language such as VHDL or Verilog. Further, source code that is not written in a native HDL language may not be portable to different FPGA vendor devices. Further, source code that is not written in a native HDL language may not have the ability to target older FPGA devices.

Therefore, there is a need for improved methods and systems for facilitating designing a programmable logic device that may overcome one or more of the above-mentioned problems and/or limitations. There is a need for an improved design method that is written in a native HDL and that adds some standardization of port interfaces. There is a need for an improved design method that increases productivity by adding an additional form of code reuse at the architectural level in addition to the component instantiation form of code used by traditional hierarchical architectures. There is a need for a design method that is not vendor-specific and possesses the capability of targeting both older and newer FPGA devices.

BRIEF SUMMARY

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

Disclosed herein is a method of designing a programmable logic device (PLD), in accordance with some embodiments. Accordingly, the method may include a step of transmitting, using a communication device, a plurality of module indications corresponding to a plurality of application modules to a client device. Further, the method may include a step of receiving, using a communication device, a Hardware Description Language (HDL) code expressing a design of the PLD from the client device. Further, the method may include a step of analyzing, using a processing device, the HDL code. Further, the method may include a step of retrieving, using a storage device, the at least one application module and the framework module corresponding to the at least one API call based on the analyzing of the HDL code. Further, the method may include a step of instantiating, using the processing device, the framework module and the at least one application module based on the retrieving. Further, the method may include a step of configuring, using the processing device, each of the plurality of common synchronous logic components and the interconnect infrastructure based on the at least one API call. Further, the method may include a step of generating, using the processing device, a flat framework circuit data corresponding to the PLD based on the instantiating and the configuring. Further, the method may include a step of transmitting, using the communication device, the flat framework circuit data to the client device.

Further disclosed herein a non-transitory computer-readable medium having stored thereon Hardware Description Language (HDL) code corresponding to a plurality of application modules corresponding to a plurality of applications for facilitating designing of a programmable logic device (PLD), in accordance with some embodiments. Further, each application module of the plurality of application modules may include a standard port interface. Further, the plurality of application modules may be configured to facilitate designing of the PLD utilizing a non-hierarchical architecture may include a framework module and the plurality of application modules. Further, the framework module may include a plurality of common synchronous logic components shared by the plurality of application modules through the standard port interface.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

FIG. 14 is an illustration of a code for facilitating instantiation of common components and a framework module, in accordance with some embodiments.

FIG. 15 is an illustration of a code of a port interface of an application module, in accordance with some embodiments.

FIG. 16 is an illustration of a code of an application module, in accordance with some embodiments.

FIG. 17 is an illustration of a code of the application module, in accordance with some embodiments.

FIG. 26 is an illustration of a code of a fixed port interface of an application module, in accordance with some embodiments.

FIG. 27 is an illustration of a code of an API (application programming interface) call, in accordance with some embodiments.

FIG. 28 is an illustration of a code of the API (application programming interface) call, in accordance with some embodiments.

FIG. 29 is an illustration of a code of a package file, in accordance with some embodiments.

FIG. 30 is an illustration of a code of an API (application programming interface) call, in accordance with some embodiments.

DETAILED DESCRIPTION

Figure 1:
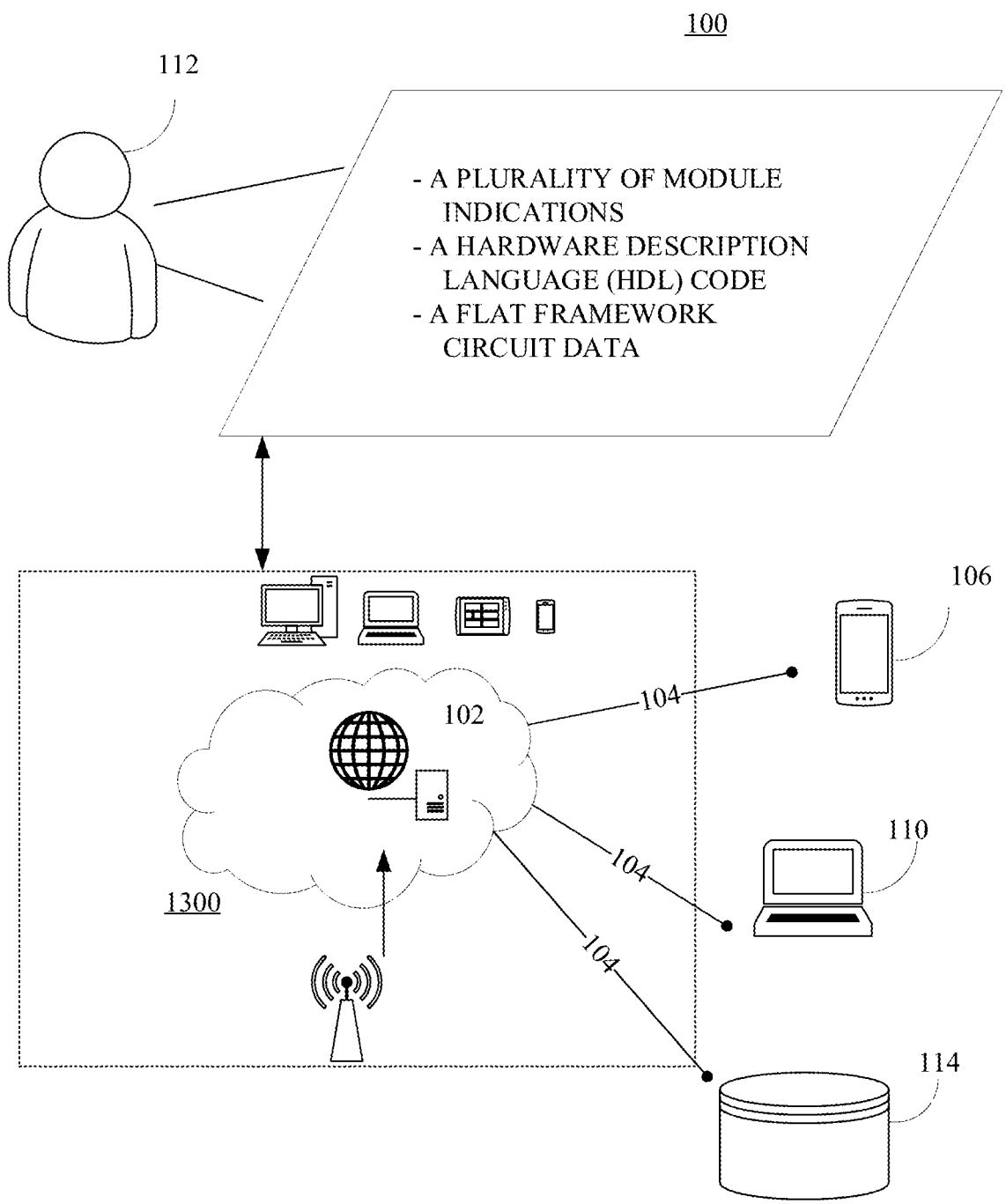
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim limitation found herein and/or issuing here from that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the claims found herein and/or issuing here from. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of methods and systems for facilitating designing a programmable logic device embodiments of the present disclosure are not limited to use only in this context.

In general, the method disclosed herein may be performed by one or more computing devices. For example, in some embodiments, the method may be performed by a server computer in communication with one or more client devices over a communication network such as, for example, the Internet. In some other embodiments, the method may be performed by one or more of at least one server computer, at least one client device, at least one network device, at least one sensor, and at least one actuator. Examples of the one or more client devices and/or the server computer may include, a desktop computer, a laptop computer, a tablet computer, a personal digital assistant, a portable electronic device, a wearable computer, a smartphone, an Internet of Things (IoT) device, a smart electrical appliance, a video game console, a rack server, a super-computer, a mainframe computer, mini-computer, micro-computer, a storage server, an application server (e.g. a mail server, a web server, a real-time communication server, an FTP server, a virtual server, a proxy server, a DNS server, etc.), a quantum computer, and so on. Further, one or more client devices and/or the server computer may be configured for executing a software application such as, for example, but not limited to, an operating system (e.g. Windows, Mac OS, Unix, Linux, Android, etc.) in order to provide a user interface (e.g. GUI, touch-screen based interface, voice-based interface, gesture-based interface, etc.) for use by the one or more users and/or a network interface for communicating with other devices over a communication network. Accordingly, the server computer may include a processing device configured for performing data processing tasks such as, for example, but not limited to, analyzing, identifying, determining, generating, transforming, calculating, computing, compressing, decompressing, encrypting, decrypting, scrambling, splitting, merging, interpolating, extrapolating, redacting, anonymizing, encoding and decoding. Further, the server computer may include a communication device configured for communicating with one or more external devices. The one or more external devices may include, for example, but are not limited to, a client device, a third-party database, a public database, a private database, and so on. Further, the communication device may be configured for communicating with the one or more external devices over one or more communication channels. Further, the one or more communication channels may include a wireless communication channel and/or a wired communication channel. Accordingly, the communication device may be configured for performing one or more of transmitting and receiving of information in electronic form. Further, the server computer may include a storage device configured for performing data storage and/or data retrieval operations. In general, the storage device may be configured for providing reliable storage of digital information. Accordingly, in some embodiments, the storage device may be based on technologies such as, but not limited to, data compression, data backup, data redundancy, deduplication, error correction, data fingerprinting, role-based access control, and so on.

Further, one or more steps of the method disclosed herein may be initiated, maintained, controlled, and/or terminated based on a control input received from one or more devices operated by one or more users such as, for example, but not limited to, an end-user, an admin, a service provider, a service consumer, an agent, a broker and a representative thereof. Further, the user as defined herein may refer to a human, an animal or an artificially intelligent being in any state of existence, unless stated otherwise, elsewhere in the present disclosure. Further, in some embodiments, the one or more users may be required to successfully perform authentication in order for the control input to be effective. In general, a user of the one or more users may perform authentication based on the possession of a secret human-readable secret data (e.g. username, password, passphrase, PIN, secret question, secret answer, etc.) and/or possession of a machine-readable secret data (e.g. encryption key, decryption key, bar codes, etc.) and/or or possession of one or more embodied characteristics unique to the user (e.g. biometric variables such as but not limited to, fingerprint, palm-print, voice characteristics, behavioral characteristics, facial features, iris pattern, heart rate variability, evoked potentials, brain waves, and so on) and/or possession of a unique device (e.g. a device with a unique physical and/or chemical and/or biological characteristic, a hardware device with a unique serial number, a network device with a unique IP/MAC address, a telephone with a unique phone number, a smartcard with an authentication token stored thereupon, etc.). Accordingly, the one or more steps of the method may include communicating (e.g. transmitting and/or receiving) with one or more sensor devices and/or one or more actuators in order to perform authentication. For example, the one or more steps may include receiving, using the communication device, the secret human-readable data from an input device such as, for example, a keyboard, a keypad, a touch-screen, a microphone, a camera, and so on. Likewise, the one or more steps may include receiving, using the communication device, the one or more embodied characteristics from one or more biometric sensors.

Further, one or more steps of the method may be automatically initiated, maintained, and/or terminated based on one or more predefined conditions. In an instance, the one or more predefined conditions may be based on one or more contextual variables. In general, the one or more contextual variables may represent a condition relevant to the performance of the one or more steps of the method. The one or more contextual variables may include, for example, but are not limited to, location, time, identity of a user associated with a device (e.g. the server computer, a client device, etc.) corresponding to the performance of the one or more steps, environmental variables (e.g. temperature, humidity, pressure, wind speed, lighting, sound, etc.) associated with a device corresponding to the performance of the one or more steps, physical state and/or physiological state and/or psychological state of the user, physical state (e.g. motion, direction of motion, orientation, speed, velocity, acceleration, trajectory, etc.) of the device corresponding to the performance of the one or more steps and/or semantic content of data associated with the one or more users. Accordingly, the one or more steps may include communicating with one or more sensors and/or one or more actuators associated with the one or more contextual variables. For example, the one or more sensors may include, but are not limited to, a timing device (e.g. a real-time clock), a location sensor (e.g. a GPS receiver, a GLONASS receiver, an indoor location sensor, etc.), a biometric sensor (e.g. a fingerprint sensor), an environmental variable sensor (e.g. temperature sensor, humidity sensor, pressure sensor, etc.) and a device state sensor (e.g. a power sensor, a voltage/current sensor, a switch-state sensor, a usage sensor, etc. associated with the device corresponding to performance of the or more steps).

Further, the one or more steps of the method may be performed one or more number of times. Additionally, the one or more steps may be performed in any order other than as exemplarily disclosed herein, unless explicitly stated otherwise, elsewhere in the present disclosure. Further, two or more steps of the one or more steps may, in some embodiments, be simultaneously performed, at least in part. Further, in some embodiments, there may be one or more time gaps between performance of any two steps of the one or more steps.

Further, in some embodiments, the one or more predefined conditions may be specified by the one or more users. Accordingly, the one or more steps may include receiving, using the communication device, the one or more predefined conditions from one or more and devices operated by the one or more users. Further, the one or more predefined conditions may be stored in the storage device. Alternatively, and/or additionally, in some embodiments, the one or more predefined conditions may be automatically determined, using the processing device, based on historical data corresponding to performance of the one or more steps. For example, the historical data may be collected, using the storage device, from a plurality of instances of performance of the method. Such historical data may include performance actions (e.g. initiating, maintaining, interrupting, terminating, etc.) of the one or more steps and/or the one or more contextual variables associated therewith. Further, machine learning may be performed on the historical data in order to determine the one or more predefined conditions. For instance, machine learning on the historical data may determine a correlation between one or more contextual variables and performance of the one or more steps of the method. Accordingly, the one or more predefined conditions may be generated, using the processing device, based on the correlation.

Further, one or more steps of the method may be performed at one or more spatial locations. For instance, the method may be performed by a plurality of devices interconnected through a communication network. Accordingly, in an example, one or more steps of the method may be performed by a server computer. Similarly, one or more steps of the method may be performed by a client computer. Likewise, one or more steps of the method may be performed by an intermediate entity such as, for example, a proxy server. For instance, one or more steps of the method may be performed in a distributed fashion across the plurality of devices in order to meet one or more objectives. For example, one objective may be to provide load balancing between two or more devices. Another objective may be to restrict a location of one or more of an input data, an output data and any intermediate data therebetween corresponding to one or more steps of the method. For example, in a client-server environment, sensitive data corresponding to a user may not be allowed to be transmitted to the server computer. Accordingly, one or more steps of the method operating on the sensitive data and/or a derivative thereof may be performed at the client device.

Figure 19:
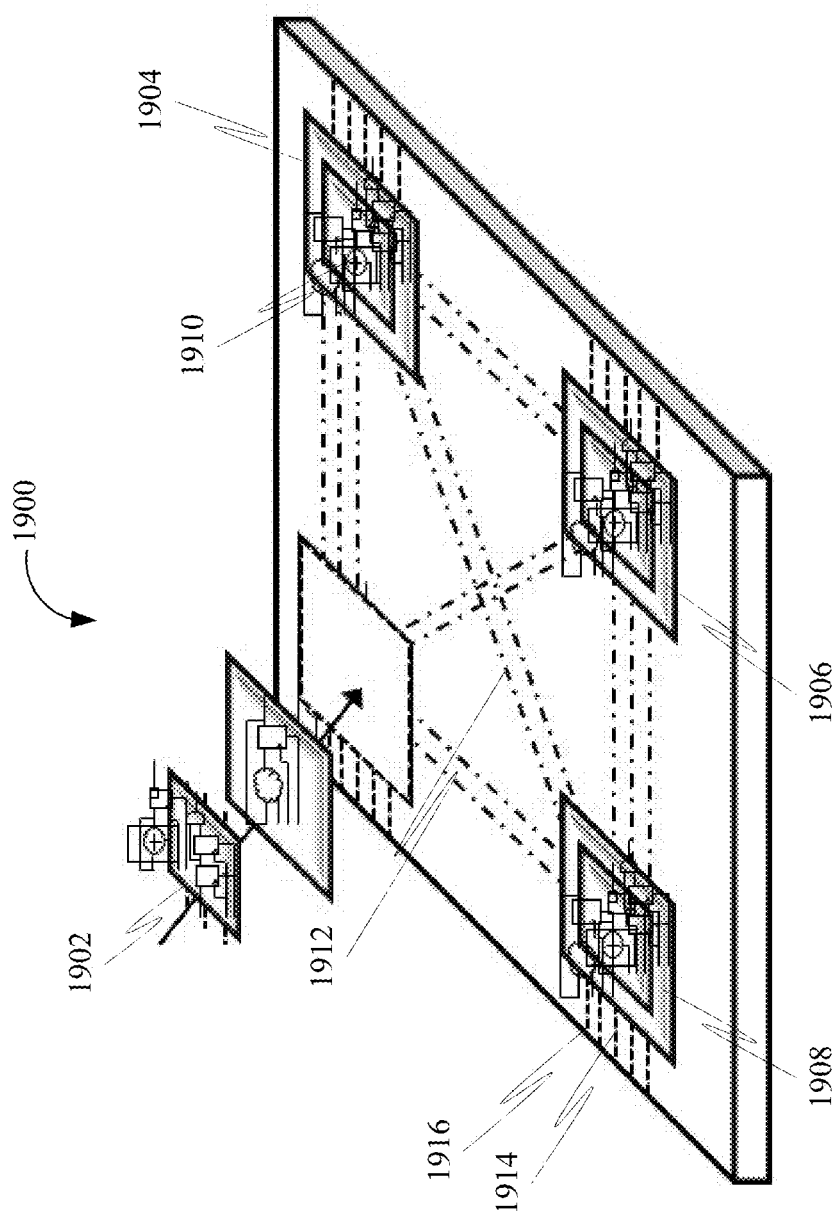
FIG. 19 is an illustration of a traditional hierarchal architecture of a programmable logic device (PLD).
Figure 20:
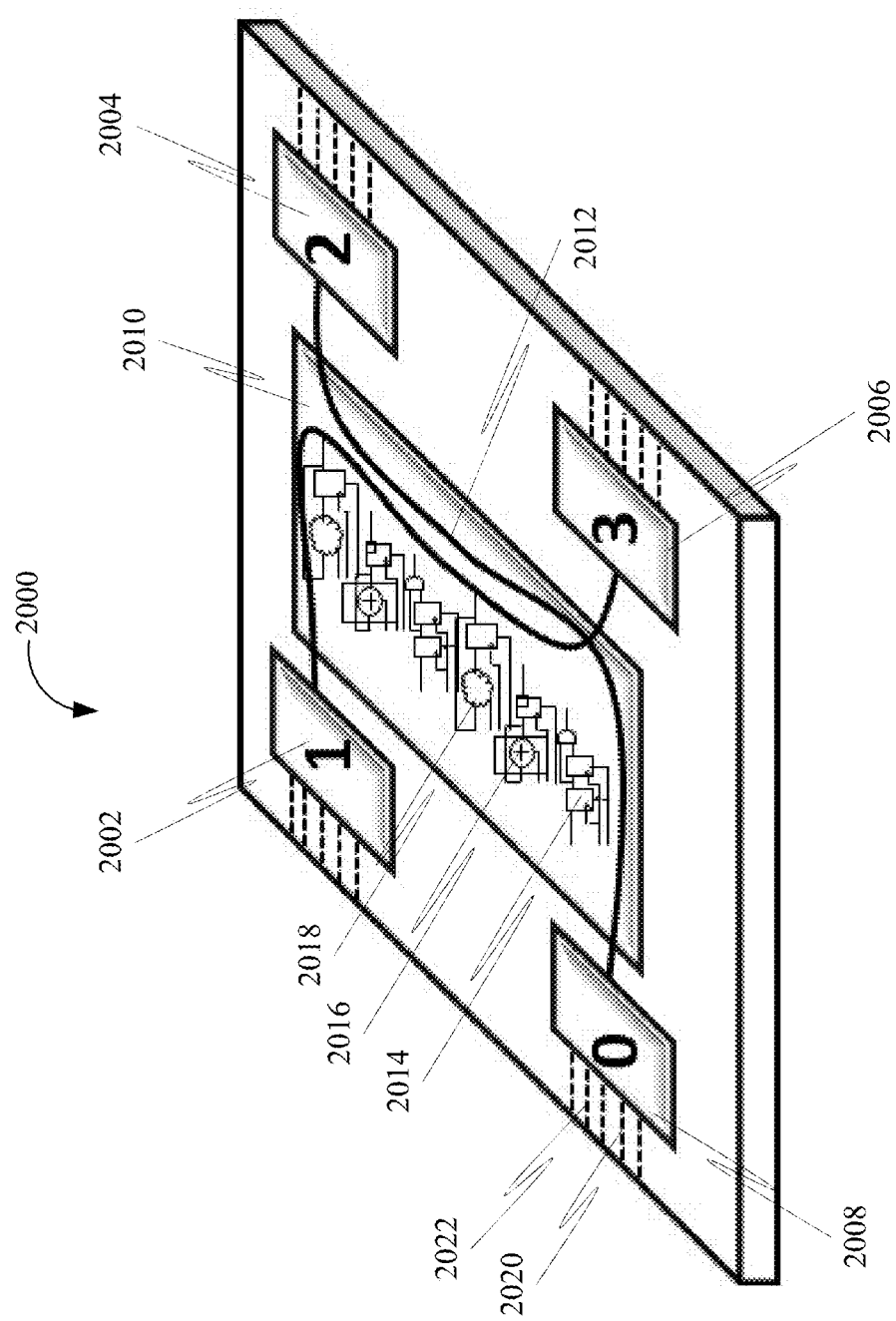
FIG. 20 is an illustration of a novel flat architecture of a programmable logic device (PLD), in accordance with some embodiments.

Overview:

The present disclosure describes methods and systems for facilitating designing a programmable logic device (PLD) or an FPGA. Further, the present disclosure describes a use of a novel synthesizable design pattern based on a flat design architecture written in a native HDL language. Further, the design pattern increases productivity by standardizing the interface between the constituent components in the design pattern and by introducing a newer form of code reuse at the architectural level. Further, the design pattern increases productivity when designing an FPGA compared to traditional HDL design methods by raising the level of abstraction from the Register Transfer Level (RTL) to a procedural programming level by use of an Application Programming Interface (API) of overloaded procedure calls. Further, the design pattern borrows concepts that have worked extremely well in the software industry, such as interfaces, API calls, shared libraries, static polymorphism, and brings an analog of those concepts to the hardware world in a manner suitable for synthesis into an FPGA, as shown in FIG. 19 and FIG. 20. Further, the overall goals of the design pattern are to increase the productivity of FPGA design by reducing development time at both the module level and system level, ease the learning curve of traditional HDL programming, and provide a workflow that is familiar to a transitioning software developer wishing to design a FPGA.

Further, a flat design architecture used by the novel design pattern differs significantly from the traditional hierarchical design architecture in both physical structure and in how a FPGA application is developed, as shown in FIG. 19 and FIG. 20. Further, the design pattern is structured as a plurality of application modules logically connected through a framework module, as shown in FIG. 20. Further, the design pattern standardizes the port interfaces of at least one application module located one layer below the top-level module. Further, the design pattern may utilize a shared framework module to provide an opportunity for code reuse of synchronous logic components at the architectural level and also may provide a means for logical interconnection between the plurality of application modules.

Figure 22:
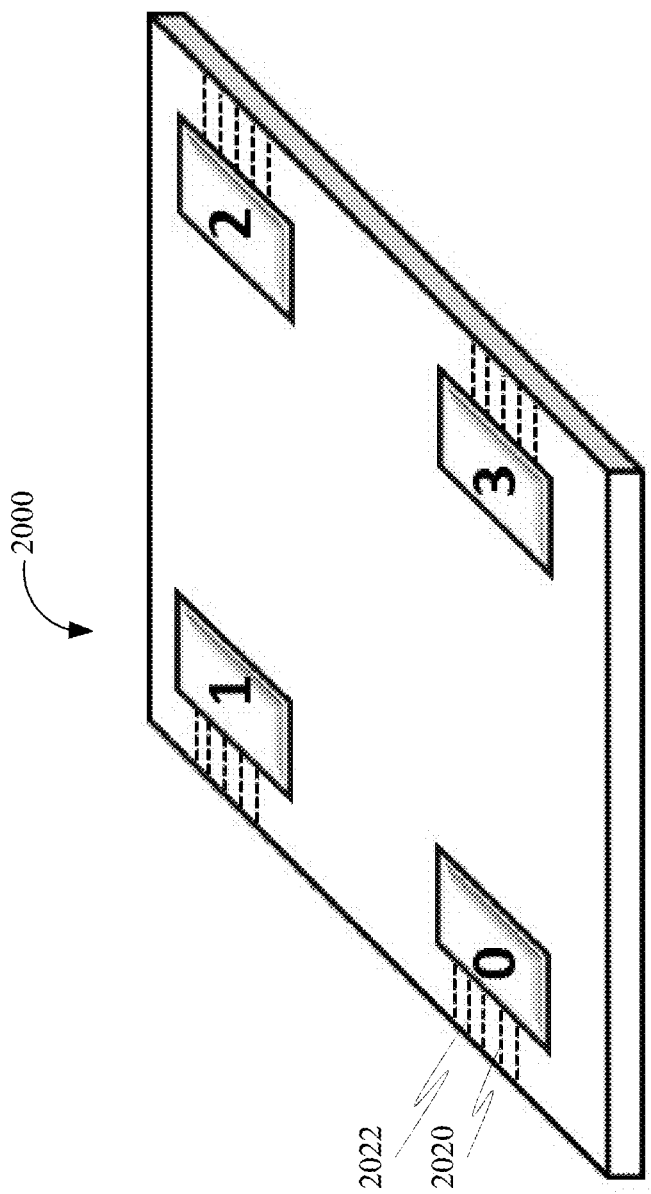
FIG. 22 is an illustration of the novel flat architecture of the programmable logic device (PLD) without the at least one framework module, in accordance with some embodiments.

Further, an application module in the design pattern may be described as a VHDL entity that may be located in at least one-level under the top-level module that may implement a fixed port interface, as shown in FIG. 26. Further, the fixed port interface of the application module may consist of at least one VHDL generic integer index and may consist of seven interface signals. Further, the seven interface signals may be described as:
 (a) A system clock: clk
 (b) A system reset: reset
 (c) An input vector: sm_input
 (d) An output vector: sm_output
 (e) An input output vector: sm_io
 (f) An output of next state logic: next_state_rec
 (g) An input of state registered logic: state_reg_rec Further, the sm_input, the sm_input, and the sm_io signals, in an instance, are routed directly to the top-level module in the design pattern. Further, the sm_input, the sm_input, and the sm_io signals, in an instance, are not routed to another application module in the design pattern. Further, the sm_input, the sm_input, and the sm_io signals may be destined directly for FPGA I/O pins, as shown in FIG. 22, in the design pattern. Further, this differs from the traditional hierarchical approach to I/O of a module where inputs and outputs from a component may be destined to other components with the use of user-defined signals in an ad-hoc fashion. Further, in order to provide standardization in connection of application modules, at least two auxiliary signals, such as next_state_rec, and state_reg_rec may be routed to and from the framework module. Further, the next_state_rec, and state_reg_rec, signals may include an abstract array of record type and may carry the desired configuration and current configuration information of the application modules that may be utilized on at least one API call, as shown in FIG. 27. Further, the desired configuration information may reference the next state logic of the generalized state machine, and the current configuration information may reference the state registered logic of the generalized state machine.

Further, constraining the port interface of at least one application module to be fixed and identical to at least one other application module has several important consequences. The constraint amongst other things:
 (a) Enforces the use of the API calls for application module-to-application module interconnection through the framework module.
 (b) Encourages application modules to use the synchronous logic resources available from the framework instead of manually coding these common components.
 (c) Enhances readability of the VHDL code by promoting the use of the same procedure calls in every application module
 (d) Allows for ease of integration, addition, removal, or testing of application modules at the top-level.

Figure 23:
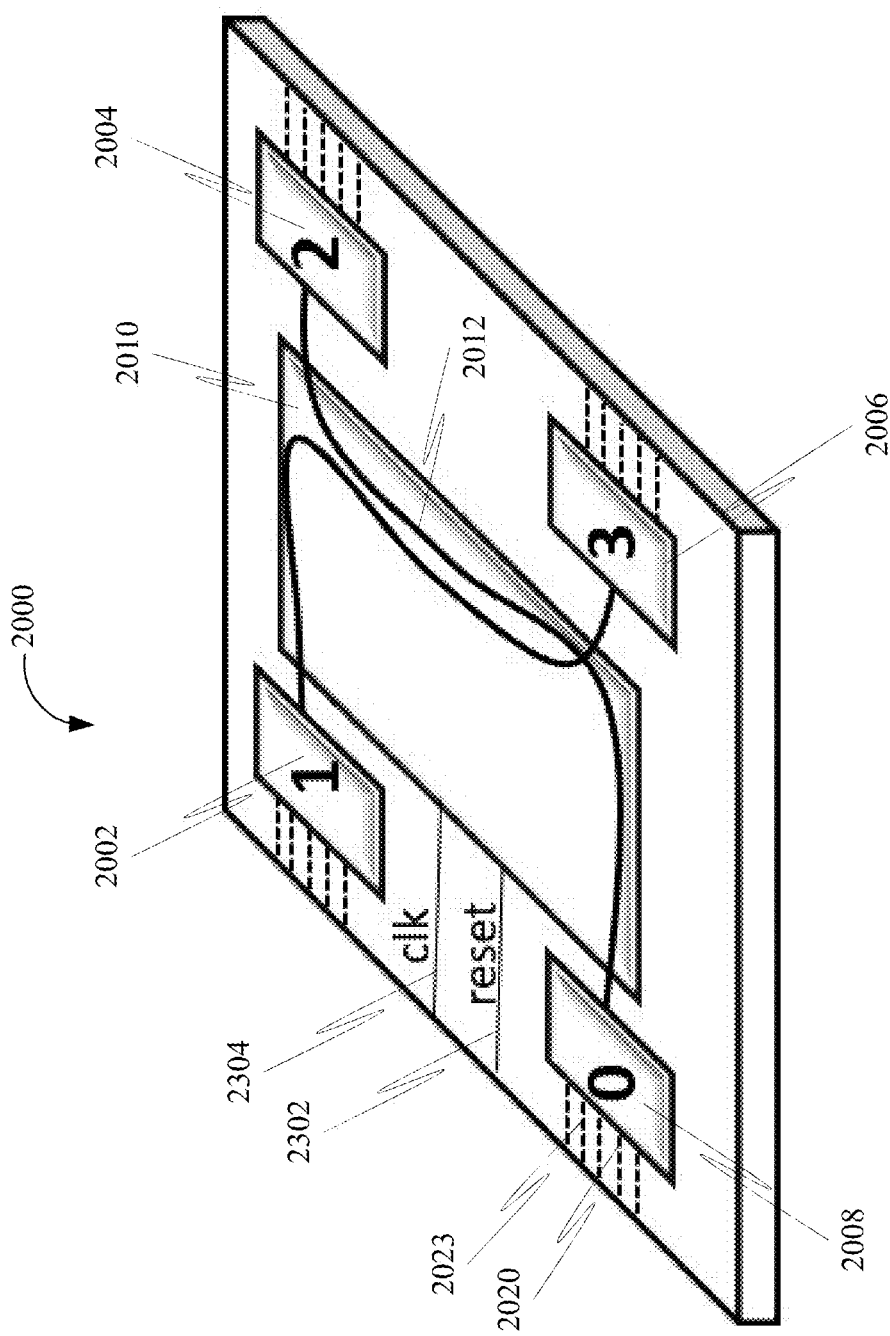
FIG. 23 is an illustration of the novel flat architecture of the programmable logic device (PLD), in accordance with some embodiments.
Figure 24:
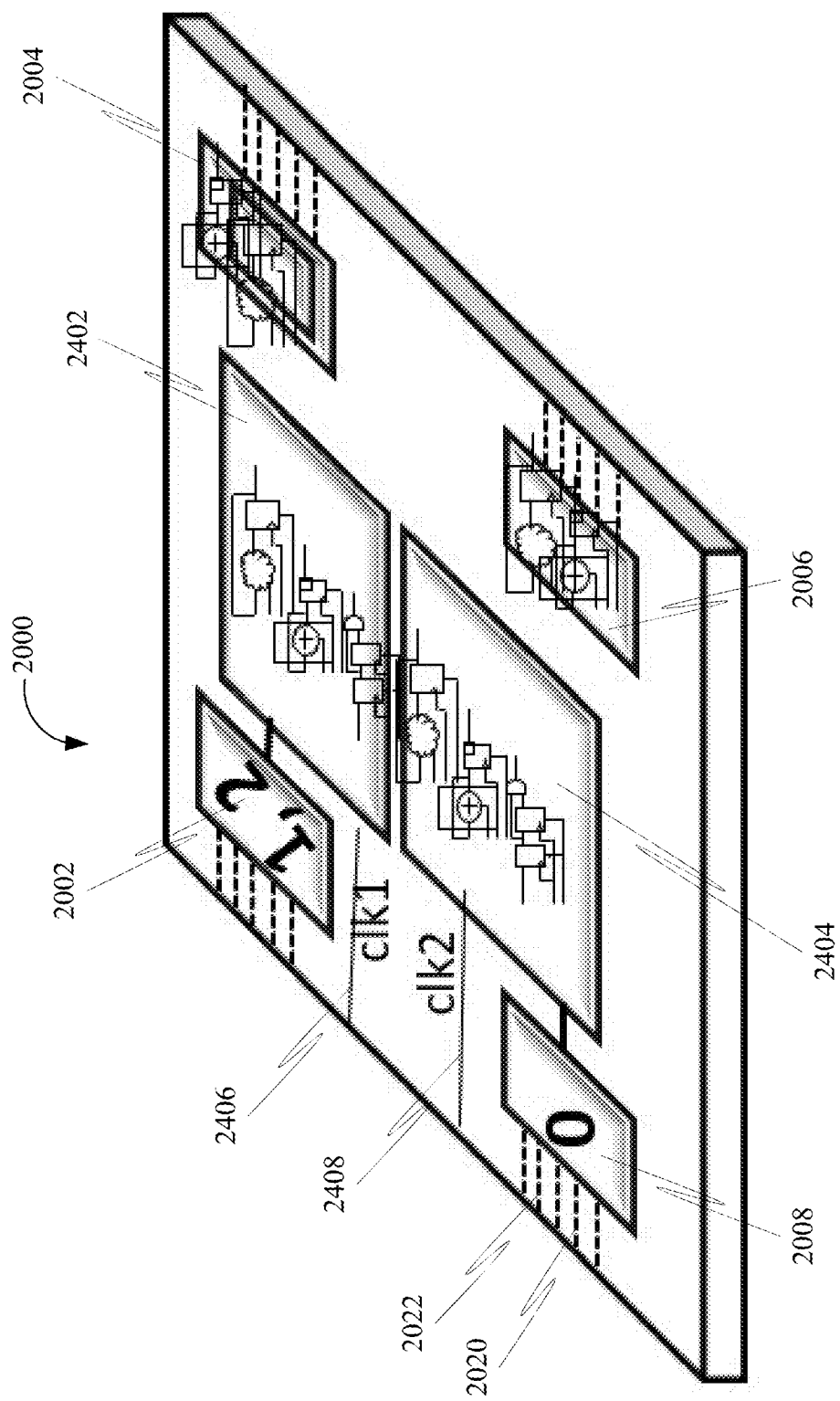
FIG. 24 is an illustration of the novel flat architecture of the programmable logic device (PLD), in accordance with some embodiments.

Further, a framework module in the design pattern may be described as a VHDL entity operating on the same clock domain and sharing the same reset signal with at least one application module, as shown in FIG. 23. Further, a plurality of framework modules is connected to at least one application module. Further, the plurality of framework modules may be operating based on a plurality of clock domains. Further, the plurality of clock domains may be dissimilar, as shown in FIG. 24. Further, one purpose of the framework module may be to implement an array of synchronous logic resources that may be requested by at least one application module by utilizing at least one API call to the framework module, as shown in FIG. 27. Further, the synchronous logic resources that may be implemented by the at least one framework module may include at least one state machine, edge detection circuit, counter, FIFO, shared control register, memory, and an event broadcasting mechanism, etc. Further, the interface to the at least one framework module may be of abstract signal type. Further, the interface to the framework may be an array of next_state_rec of nsr_array type and an array of state_reg_rec of srr_array type that may connect to the next_state_rec and state_reg_rec of the application modules. Further, each application module may receive a subarray of the next_state_rec and state_reg_rec from the framework module that may be indexed to utilize an array of resources from the framework. Further, a single framework module may be shared by a plurality of application modules. Further, by use of a shared framework module, the flat design architecture introduces a newer form of code reuse at the architectural level that does not exist with the traditional hierarchical design architecture, as shown in FIG. 19 and FIG. 20.

Further, another purpose of a framework module may be to provide logical interconnection between a plurality application modules. Further, a logical connection between a plurality of application modules that may be made through the at least one framework module by the use of at least one API procedure call and may pass a constant integer value, as shown in FIG. 28. Further, a connection between a plurality of application modules may only require at least one API call to pass data to and from at least one first application module to at least one second application module through the framework module. Further, in order for the at least one first application module to identify at least one second application module to read from or write data to, at least one constant integer may be defined in the USER_DEFS_PKG.vhd that may mirror the same identifier as the entity name of the module that may be referenced, as shown in FIG. 29. Further, when a programmer uses an API call such READ_FIFO_DATA( . . . ) or WRITE_FIFO_DATA( . . . ), to communicate between at least one first application module to at least one second application module, it may appear to the programmer that the API call is referencing the other application module by name. However, what really may happen is that the constant integer that may mirror the entity name of the other application module which may be defined in USER_DEFS_PKG.vhd may be used to index into the array of next_state_rec logic that may be routed to the at least one framework module. Further, the notion of logical interconnection between the plurality of application modules may be a much more flexible concept than wired interconnection using signal assignments in a traditional hierarchical design, as shown in FIG. 19 and FIG. 20. Further, at least one framework module may include a communication channel that may consist of a control register, a data register, a FIFO, a shared memory, etc. Further, in order for a user to change the type of logical interconnection between the plurality of application modules by use of the design pattern, the user may only need to change at least one API call in at least one of the plurality of application modules, as shown in FIG. 27 and FIG. 28. Further, in order to change the actual application modules that may be connected on the same type of communication channel, the user may need to change a single integer value that may be passed to the at least API call, as shown in FIG. 27 and FIG. 28.

Further, the notion of the logical interconnection of the plurality of application modules through at least one framework model differs significantly from the traditional way in which the components are connected in a hierarchical design architecture. Further, in the traditional hierarchical design architecture, the connection of a plurality of components may require additional user defined signals to be defined in order to connect to the port interface of at least one component to the port of at least one other component (as shown in FIG. 19 and FIG. 20). Further, with the novel design pattern, the connection of at least one application module may only require either a change of an at least one API call or a change of an integer parameter passed to at least one API call. Further, the application modules usage of the at least one framework may be a transparent process by the use at least one API call. Further, ease of logical interconnect through the at least one framework module or by use of an API call with an integer parameter may be possible only because the novel design pattern that implements a flat architecture. Further, with a flat architecture, the logical interconnection of at least one application module may only require a constant integer index because the at least one application module may be known to reside at a location at least one level under the top-level module. Further, without the flat architecture, logical indexing may become significantly more complex because signals may need to be defined and may need to be routed to an arbitrary level in a design hierarchy. Further, the use of logical interconnection using a flat design architecture significantly enhances productivity by speeding up development time when connecting at least one application module as compared to the traditional methods of connecting components in a hierarchical design architecture.

Further, the at least one framework module may be implemented as a generalized array of state machines. Further, the synchronous logic components may be treated as state machines. Further, the differences in the functionality of the synchronous logic components lie in the difference of the contents of the next state logic functions. Further, counters, FIFOs, edge detection circuits, and even simple registers are indeed all state machines as shown in FIG. 6, FIG. 7, FIG. 8, FIG. 9, and FIG. 25. Further, the synchronous components including memories, shift registers, etc, may also be implemented as generalized state machines. Further, the choice to implement the framework module as a generalized array of state machines has several strategic advantages, such as:

(a) Providing a mechanism for uniform treatment of all synchronous logic components when implemented inside the at least one framework module.
(b) Providing for the same treatment for logical interconnection of at least one application module as the treatment of synchronous logic components.
(c) Only requiring the use of at least two abstract signal types that are fixed at the port interface of the application modules
(d) Providing a uniform calling structure for API calls with at least two auxiliary abstract signals. Further, any parameters before these two signals may be required, and any signals appearing after these signals may be optional.
(e) Providing for a way to add future functionality of possibly more synchronous logic components or different logical ways of interconnection without breaking any pre-existing code because the signal types may be abstract.

Figure 21:
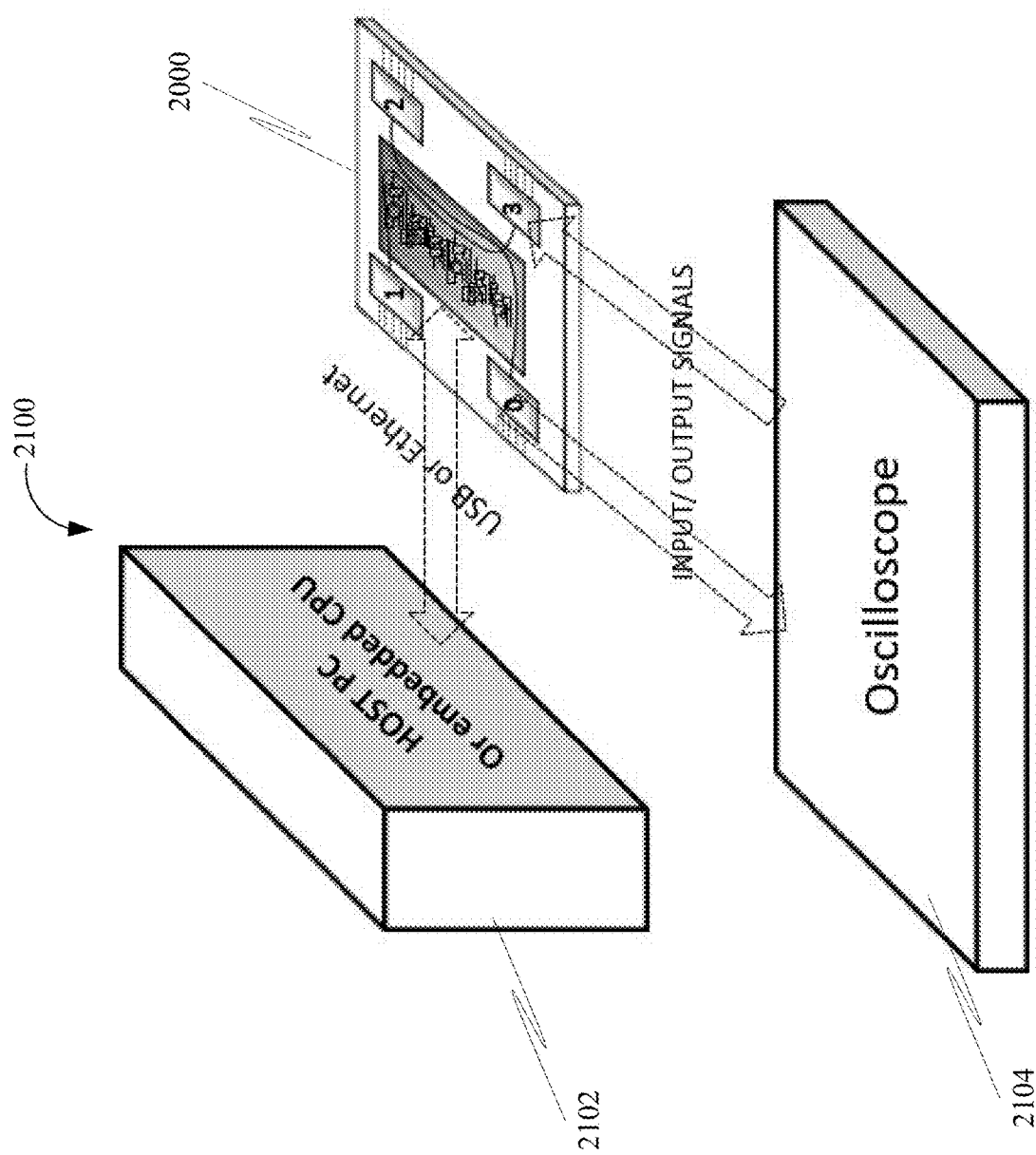
FIG. 21 is a schematic representation of a system for facilitating loop testing of the PLD, in accordance with some embodiments.

Further, the at least one framework module may implement a control signal interface that may be utilized by a host or embedded computer. Further, the host or embedded computer may indirectly interface with any of the at least one application module through the use of logical interconnection provided by the at least one framework module. Further, the host or embedded computer may facilitate in-circuit testing and visualization of at least one state machine data-path, as shown in FIG. 21.

Further, by design, there are several similarities in how the novel design pattern is organized and how a software application is developed. Further, in order to mimic public interface files and shared libraries in the software world, the design pattern may use two VHDL package files to expose the API to a developer. Further, global constants that may be needed to be shared across all application modules or constants that may be needed to parameterize the at least one framework module, may be defined in the USER_DEFS_PKG.vhd. Further, in order to separate user parametrization from the actual implementation of functionality, the implementation of the at least one framework module and the implementation of the at least one API calls may be located in SM_API_PKG.vhd package file, as shown in FIG. 29. Further, the manner in which the at least one application module may utilize an array of hardware resources from a single framework module by use of API calls is very similar to how multiple software applications utilize a single shared library from a computer operating system. Further, in a similar way that software applications need not to statically compile binary code into each individual application when using a shared library, with the design pattern, synchronous logic resources that are used from the shared framework module may not be synthesized directly into at least one application module by a synthesis tool.

Further, there is also a notable difference in the manner that a software application uses a shared library and the way the novel design pattern uses a shared framework module for code reuse when synthesized to a FPGA. Further, with a software shared library, the intent is that each software application may share the exact same binary code of the shared library thus reducing the overall software footprint. However, the intent of the novel design pattern is to create synchronous logic resources that can be accessed from the at least one application module and are suitable to be synthesized into an FPGA. Further, this means that the VHDL code that may exist in the SM_API_PKG.vhd may possibly be shared when simulating the design. However, when implemented in actual FPGA hardware, the at least one application module may need to have access to its own individual hardware resources. Thus, an array of hardware resources may need to be implemented and one or more modules must have the ability to index into the hardware array of resources implemented inside the at least one framework module. Further, a numerical index that may be used to index into the hardware array of resources may be the VHDL generic constant integer that may be required as part of the fixed port interface of one or more application modules. Further, this constant integer index may be defined in the USER_DEFS_PKG.vhd file and may mirror the same name of the at least one application module entity name for convenience. Further, the naming convention of the constant integer index may not be necessary. Further, a constant integer may need to be defined before the HDL design is simulated or synthesized.

Further, testing of an HDL design using the novel design pattern using a flat architecture differs from the traditional approach to testing of an HDL design using a traditional hierarchical design architecture. Further, with the traditional hierarchical design, it may be necessary for the developer to write a custom testbench file to provide stimulus to a component. Further, with the traditional testing of a hierarchical design, a test bench stimulus file may need to implement a port interface that matches the component that may need to be tested. Further, with the novel design pattern, one or more application modules may be required to have a fixed port face that may be required to match one or more other application modules. Further, testing may be done with the same API as the one or more application modules use to implement application-specific logic. Further, in order to keep track of the number of clock cycles that have occurred, timing functions may be part of the same API that is implemented in the design pattern. Further, timing functions may reference individual clock counts, microseconds, milliseconds, seconds worth of time-units relative to the system clock of the design. Further, the timing functions that may be part of the API may take an integer or real data type as a parameter. Further, the timing functions may return an integer value which may be synthesizable.

Further, for a FPGA design of equal functionality, HDL code written using the novel design pattern using a flat architecture may require substantially fewer lines of HDL code compared to an equivalent HDL design that does not use the design pattern. Further, using the at least two auxiliary signals, such as next_state_rec and state_reg_rec of abstract type at the interface of the application module may vastly reduce the number of signals that need to be declared inside at least one application module, as shown in FIG. 16 and FIG. 17. Further, HDL code written using the novel design pattern using a flat architecture design pattern may use significantly fewer process statements and significantly less if-then-else statements then the corresponding hierarchical design approach. Further, it may be common for the design pattern to use just one process statement. Further, the clock and reset signal may not need to be referenced inside the process statement by at least one application module, as shown in FIG. 16 and FIG. 17. Further, a plurality of application modules may use a shared framework module. Further, a shared framework module may handle the clock and reset signal for a plurality of application modules. Further, the use of the design pattern and may have implications that positively impact productivity, readability, maintainability, and testability compared to the traditional hierarchical approach. Further, the present disclosure describes a novel design pattern with a flat design architecture. Further, the design pattern may have a very broad application space and may have the potential for usage as a general HDL programming technique. Further, the underlying flat architecture that is used to support the design pattern may even be preferred over a traditional hierarchical architecture when FPGA development is being done in an agile development environment when system level specifications may be loosely defined and may be expected to change. Further, at least one application module may have direct access to the top-level port of the FPGA. Further, because at least one application module may have direct access to the top-level port of the FPGA, at least one application module may not have a dependency on at least one other application module. Further, if at least one application module may not have a dependency on at least one other application module, it may be easier to add or remove functionality from an FPGA design without disturbing another part of the FPGA design.

Further, the present disclosure may describe a method of designing a programmable logic device (PLD) or Field Programmable Gate Array (FPGA) based on a flat design architecture. Further, the method introduces a novel synthesizable design pattern written in a native Hardware Description Language HDL that standardizes port interfaces between application modules and interconnects the application modules using a shared framework module. The shared framework module provides a logical interconnection between the application modules and implements arrays of synchronous logic resources that can be configured by the application modules using an API of overloaded procedure calls. Further, the use of standardized interfaces and API level programming for designing the PLD or FPGA in the native HDL language increases productivity by providing an abstraction layer that is higher than the traditional Register Transfer Level (RTL) and by introducing a newer form of code reuse at the architectural level.

FIG. 1 is an illustration of an online platform 100 consistent with various embodiments of the present disclosure. By way of non-limiting example, the online platform 100 to facilitate designing a programmable logic device may be hosted on a centralized server 102, such as, for example, a cloud computing service. The centralized server 102 may communicate with other network entities, such as, for example, a mobile device 106 (such as a smartphone, a laptop, a tablet computer, etc.), other electronic devices 110 (such as desktop computers, server computers, etc.), and databases 114 over a communication network 104, such as, but not limited to, the Internet. Further, users of the online platform 100 may include relevant parties such as, but not limited to, end-users, administrators, clients, service providers, service consumers, and so on. Accordingly, in some instances, electronic devices operated by the one or more relevant parties may be in communication with the platform.

A user 112, such as the one or more relevant parties, may access online platform 100 through a web-based software application or browser. The web-based software application may be embodied as, for example, but not be limited to, a website, a web application, a desktop application, and a mobile application compatible with a computing device 1300.

Figure 2:
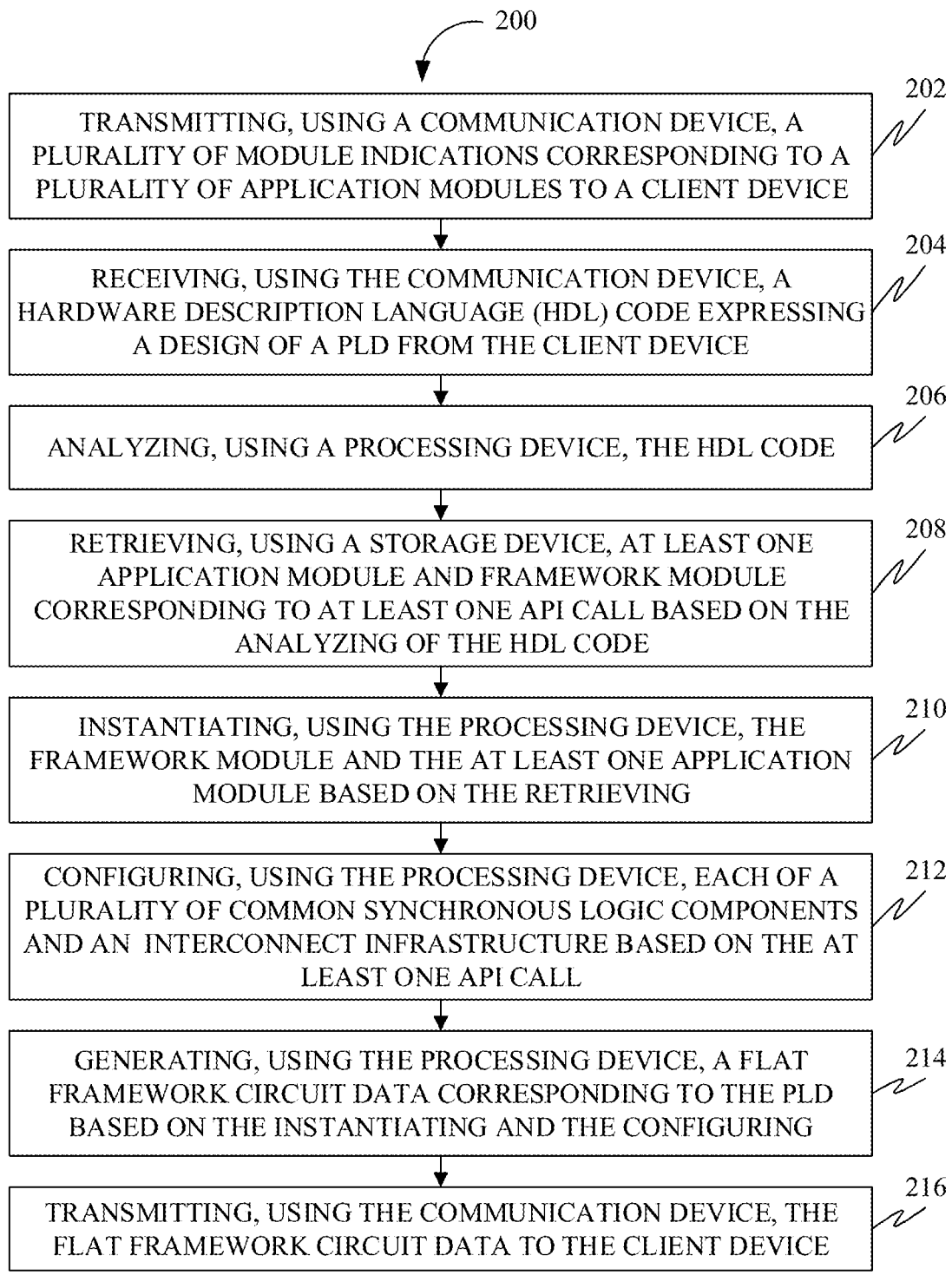
FIG. 2 is a flowchart of a method of designing a programmable logic device (PLD), in accordance with some embodiments.

FIG. 2 is a flowchart of a method 200 of designing a programmable logic device (PLD), in accordance with some embodiments. Further, at 202, the method 200 may include a step of transmitting, using a communication device, a plurality of module indications corresponding to a plurality of application modules to a client device (such as the mobile device 106, the electronic devices 110, etc.). Further, the client device may include a computing device such as a smartphone, a tablet, a desktop, a laptop, a smartwatch, and so on. Further, the client device may be associated with at least one client (such as the user 112). Further, the at least one client may be an individual, an institution, an organization, etc.

Further, at 204, the method 200 may include a step of receiving, using the communication device, a Hardware Description Language (HDL) code expressing a design of the PLD from the client device. Further, the HDL code may be based on a non-hierarchical architecture may include a framework module and a plurality of application modules. Further, the HDL code may include at least one Application Programming Interface (API) call corresponding to at least one application module of the plurality of application modules. Further, the at least one API call may include at least one module indication of the plurality of module indications. Further, each application module of the plurality of application modules may include a standard port interface. Further, the framework module may include a plurality of common synchronous logic components shared by the plurality of application modules through the standard port interface and an interconnect infrastructure configured to interconnect the plurality of application modules.

Further, at 206, the method 200 may include a step of analyzing, using a processing device, the HDL code.

Further, at 208, the method 200 may include a step of retrieving, using a storage device, the at least one application module and the framework module corresponding to the at least one API call based on the analyzing of the HDL code. Further, the at least one application module and the framework module may be stored in at least one database (such as the databases 114).

Further, at 210, the method 200 may include a step of instantiating, using the processing device, the framework module and the at least one application module based on the retrieving.

Further, at 212, the method 200 may include a step of configuring, using the processing device, each of the plurality of common synchronous logic components and the interconnect infrastructure based on the at least one API call.

Further, at 214, the method 200 may include a step of generating, using the processing device, a flat framework circuit data corresponding to the PLD based on the instantiating and the configuring.

Further, at 216, the method 200 may include a step of transmitting, using the communication device, the flat framework circuit data to the client device.

Further, in some embodiments, the plurality of common synchronous logic components may be configured by the plurality of application modules through the standard port interface.

Further, in some embodiments, the plurality of common synchronous logic components may be configured by the plurality of application modules using a low-level signal call comprised in the HDL code.

Further, in some embodiments, a first application module of the plurality of application modules may be configured to communicate with a second application module of the plurality of application modules based on the standard port interface through the at least one API call. Further, in an embodiment, the first application module may be configured to communicate with the second application module without being intermediated by a third application module of the plurality of application modules.

Further, in some embodiments, each application module of the plurality of application modules may be configured to handle off-chip Input/Output (IO) signals based on low-level signal assignments comprised in the HDL code.

Further, in some embodiments, each application module of the plurality of application modules may be configured to directly access a top-level system port associated with the PLD.

Further, in some embodiments, the standard port interface may include an output signal interface and an input signal interface. Further, the output signal interface may be configured to be routed to the framework module for parameterization of a next state logic function. Further, the input signal interface may be configured to return a state registered logic from the framework module.

Further, in some embodiments, the plurality of common synchronous logic components may include an array of state machines.

Further, in some embodiments, the framework module may include a first array of records of next state logic corresponding to an input to the framework module and a second array of records of state registered logic corresponding to an output of the framework module. Further, an application module of the plurality of application modules may be associated with an index corresponding to the array of state machines.

Further, in some embodiments, the plurality of common synchronous logic components may include at least one of a state machine, a counter circuit, and an edge detection circuit.

Further, in some embodiments, a first standard port interface of a first design pattern may be identical to a second standard port interface of a second design pattern.

Further, in some embodiments, the programmable logic device may include at least one of a Field Programmable Gate Array (FPGA) and an Application Specific Integrated Circuit (ASIC).

Further, in some embodiments, the plurality of application modules may include a plurality of design patterns corresponding to a plurality of functionalities. Further, each functionality of the plurality of functionalities may be frequently used in the PLD.

Further, in some embodiments, the flat framework circuit data may include at least one of netlist data and a bit-file.

Further, in some embodiments, the framework module may include a plurality of framework modules. Further, the plurality of framework modules operates on a plurality of clock domains with the plurality of application modules.

Figure 3:
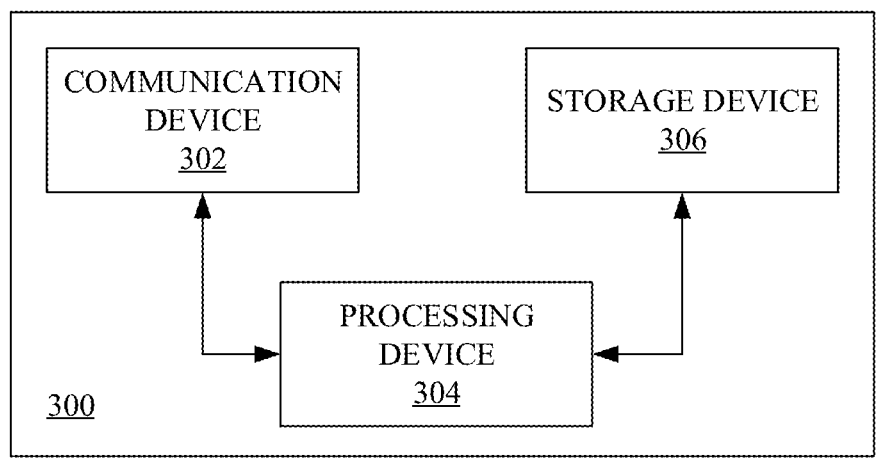
FIG. 3 is a block diagram of a system for facilitating designing a programmable logic device (PLD), in accordance with some embodiments.

FIG. 3 is a block diagram of a system 300 for facilitating designing a programmable logic device (PLD), in accordance with some embodiments. Further, the system 300 may include a communication device 302, a processing device 304, and a storage device 306.

Further, the communication device 302 may be configured for transmitting a plurality of module indications corresponding to a plurality of application modules to a client device. Further, the communication device 302 may be configured for receiving a Hardware Description Language (HDL) code expressing a design of the PLD from the client device. Further, the HDL code may be based on a non-hierarchical architecture may include a framework module and a plurality of application modules. Further, the HDL code may include at least one Application Programming Interface (API) call corresponding to at least one application module of the plurality of application modules. Further, the at least one API call may include at least one module indication of the plurality of module indications. Further, each application module of the plurality of application modules may include a standard port interface. Further, the framework module may include a plurality of common synchronous logic components shared by the plurality of application modules through the standard port interface and an interconnect infrastructure configured to interconnect the plurality of application modules. Further, the communication device 302 may be configured for transmitting a flat framework circuit data to the client device.

Further, the processing device 304 may be communicatively coupled with the communication device 302. Further, the processing device 304 may be configured for analyzing the HDL code. Further, the processing device 304 may be configured for instantiating the framework module and the at least one application module based on the retrieving. Further, the processing device 304 may be configured for configuring each of the plurality of common synchronous logic components and the interconnect infrastructure based on the at least one API call. Further, the processing device 304 may be configured for generating the flat framework circuit data corresponding to the PLD based on the instantiating and the configuring.

Further, the storage device 306 may be communicatively coupled with the processing device 304. Further, the storage device 306 may be configured for retrieving the at least one application module and the framework module corresponding to the at least one API call based on the analyzing of the HDL code.

Further, in some embodiments, the plurality of common synchronous logic components may be configured by the plurality of application modules through the standard port interface.

Further, in some embodiments, the plurality of common synchronous logic components may be configured by the plurality of application modules using a low-level signal call comprised in the HDL code.

Further, in some embodiments, a first application module of the plurality of application modules may be configured to communicate with a second application module of the plurality of application modules based on the standard port interface through the at least one API call.

Further, in some embodiments, each application module of the plurality of application modules may be configured to handle off-chip Input/Output (IO) signals based on low-level signal assignments comprised in the HDL code.

Further, in some embodiments, each application module of the plurality of application modules may be configured to directly access a top-level system port associated with the PLD.

Further, in some embodiments, the standard port interface may include an output signal interface and an input signal interface. Further, the output signal interface may be configured to be routed to the framework module for parameterization of a next state logic function. Further, the input signal interface may be configured to return a state registered logic from the framework module.

Further, in some embodiments, the plurality of common synchronous logic components may include an array of state machines.

Further, in some embodiments, the framework module may include a first array of records of next state logic corresponding to an input to the framework module and a second array of records of state registered logic corresponding to an output of the framework module. Further, an application module of the plurality of application modules may be associated with an index corresponding to the array of state machines.

Further, in some embodiments, the plurality of common synchronous logic components may include at least one of a state machine, a counter circuit, and an edge detection circuit.

According to some embodiments, a non-transitory computer-readable medium having stored thereon Hardware Description Language (HDL) code corresponding to a plurality of application modules corresponding to a plurality of applications for facilitating designing of a programmable logic device (PLD) is disclosed. Further, each application module of the plurality of application modules may include a standard port interface. Further, the plurality of application modules may be configured to facilitate designing of the PLD utilizing a non-hierarchical architecture may include a framework module and the plurality of application modules. Further, the framework module may include a plurality of common synchronous logic components shared by the plurality of application modules through the standard port interface.

Further, in some embodiments, each application module may be configured to configure the plurality of common synchronous logic components through the standard port interface.

Further, in some embodiments, each application module may be configured to configure the plurality of common synchronous logic components using a low-level signal call.

Further, in some embodiments, a first application module of the plurality of application modules may be configured to communicate with a second application module of the plurality of application modules based on the standard port interface may include an Application Programming Interface (API) call. Further, in an embodiment, the first application module may be configured to communicate with the second application module without being intermediated by a third application module of the plurality of application modules.

Further, in some embodiments, each application module of the plurality of application modules may be configured to handle off-chip Input/Output (IO) signals based on low-level signal assignments.

Further, in some embodiments, each application module of the plurality of application modules may be configured to directly access a top-level system port associated with the PLD.

Further, in some embodiments, the standard port interface may include an output signal interface and an input signal interface. Further, the output signal interface may be configured to be routed to the framework module for parameterization of a next state logic function. Further, the input signal interface may be configured to return a state registered logic from the framework module.

Further, in some embodiments, the plurality of common synchronous logic components may include an array of state machines.

Further, in some embodiments, the framework module may include a first array of records of next state logic corresponding to an input to the framework module and a second array of records of state registered logic corresponding to an output of the framework module. Further, an application module of the plurality of application modules may be associated with an index corresponding to the array of state machines.

Further, in some embodiments, the plurality of common synchronous logic components may include at least one of a state machine, a counter circuit, and an edge detection circuit.

Further, in some embodiments, a first standard port interface of a first design pattern may be identical to a second standard port interface of a second design pattern.

Further, in some embodiments, the programmable logic device may include at least one of a Field Programmable Gate Array (FPGA) and an Application Specific Integrated Circuit (ASIC).

Further, in some embodiments, the plurality of application modules may include a plurality of design patterns corresponding to a plurality of functionalities. Further, each functionality of the plurality of functionalities may be frequently used in the PLD.

Figure 4:
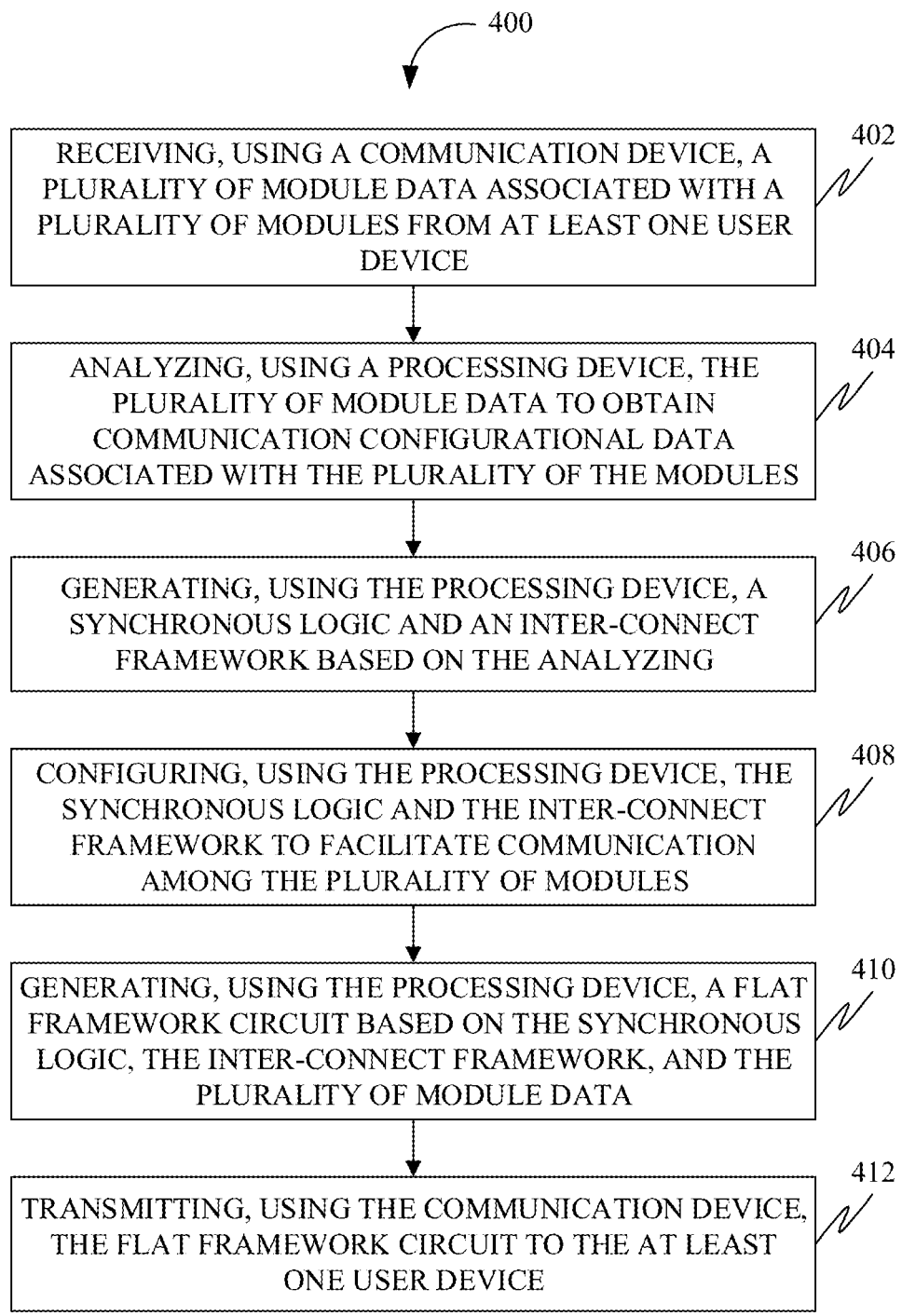
FIG. 4 is a flowchart of a method to facilitate generation of a flat framework circuit based on a flat design architecture, in accordance with some embodiments.

FIG. 4 is a flowchart of a method 400 to facilitate generation of a flat framework circuit based on a flat design architecture, in accordance with some embodiments. Accordingly, at 402 the method 400 may include a step of receiving, using a communication device, a plurality of module data associated with a plurality of modules from at least one user device. Further, the plurality of modules may be associated with a logic circuit. Further, the logic circuit may be configured to perform at least one operation. Further, each module of the plurality of modules may include at least one user-defined logic and at least one interface. Further, the user-defined logic may describe a function of the each module. Further, the at least one interface may facilitate communication of the each module with an outside world. Further, the outside world may include at least one module that may not be associated with the logic circuit. Further, the at least one interface may be configured to transmit and/or receive input signals, output signals, input signals, etc. Further, the plurality of module data may be associated with a computer language such as hardware description language (HDL), very high speed integrated circuit hardware description language (VHSIC-HDL), Verilog, and so on. Further, the plurality of module data, in an instance, may include functional data, operational data, configurational data, communication data, etc. Further, the at least one user device may be associated with at least one user. Further, the at least one user device may include a computing device configured to generate the plurality of module data. Further, the computing device may include a desktop, a laptop, a personal computer, a tablet, etc. Further, the at least one user may be an individual, an institution, and an organization that may want to generate the plurality of module data using the at least one user device.

Further, at 404 the method 400 may include a step of analyzing, using a processing device, the plurality of module data to obtain communication configurational data associated with the plurality of modules. Further, the plurality of module data may be analyzed to obtain the communication configurational data. Further, the communication configurational data may be associated with at least one configurational requirement to facilitate communication among the plurality of modules. Further, the configurational requirement may include at least one component and at least one configuration of the at least one component.

Further, at 406 the method 400 may include a step of generating, using the processing device, synchronous logic and an inter-connect framework based on the analyzing. Further, the synchronous logic and the inter-connect framework may be generated based on the communication configurational data. Further, the each module may use the synchronous logic and the inter-connect framework to communicate with the plurality of modules. Further, the synchronous logic may include at least one synchronous component. Further, the at least one synchronous component may include a state machine, a counter circuit, an edge detection circuit, etc. Further, the inter-connect framework may be associated with the configuration of the at least one synchronous component.

Further, at 408 the method 400 may include a step of configuring, using the processing device, the synchronous logic and the inter-connect framework to facilitate communication among the plurality of modules. Further, the synchronous logic and the inter-connect framework may be configured to facilitate communication among the plurality of modules. Further, the synchronous logic and the inter-connect framework may be configured using the at least one signal call associated with the each module. Further, the at least one signal call may be associated with the communication configurational data. Further, the at least one signal call may include a procedure call within an API, low-level signal call, etc.

Further, at 410 the method 400 may include a step of generating, using the processing device, a flat framework circuit based on the synchronous logic, the inter-connect framework, and the plurality of module data. Further, the flat framework circuit may be generated based on the synchronous logic, the inter-connect framework, and the plurality of module data. Further, the flat framework circuit may connect the plurality of modules using an interconnect infrastructure. Further, the synchronous logic and the inter-connect framework may facilitate communication among the plurality of modules using the interconnection infrastructure. Further, the interconnection infrastructure may include at least one data path and at least one control path. Further, the at least one data path and/or the at least one control path may be independent or loosely coupled with the at least one data path and/or the at least one control path. Further, the at least one data path may be associated with a data path crossbar. Further, the data path crossbar may include a register, a FIFO, a memory block, etc. Further, the at least one control path may be associated with a control path crossbar. Further, the control path crossbar may include a register, a FIFO, a memory block, etc. Further, each module of the plurality of modules may directly communicate with the each module using the flat framework architecture.

Further, at 412 the method 400 may include a step of transmitting, using the communication device, the flat framework circuit to the at least one user device. Further, the flat framework circuit may be transmitted to the at least one user device associated with at least one user. Further, the at least one user may use the flat framework circuit to perform at least one operation.

Figure 5:
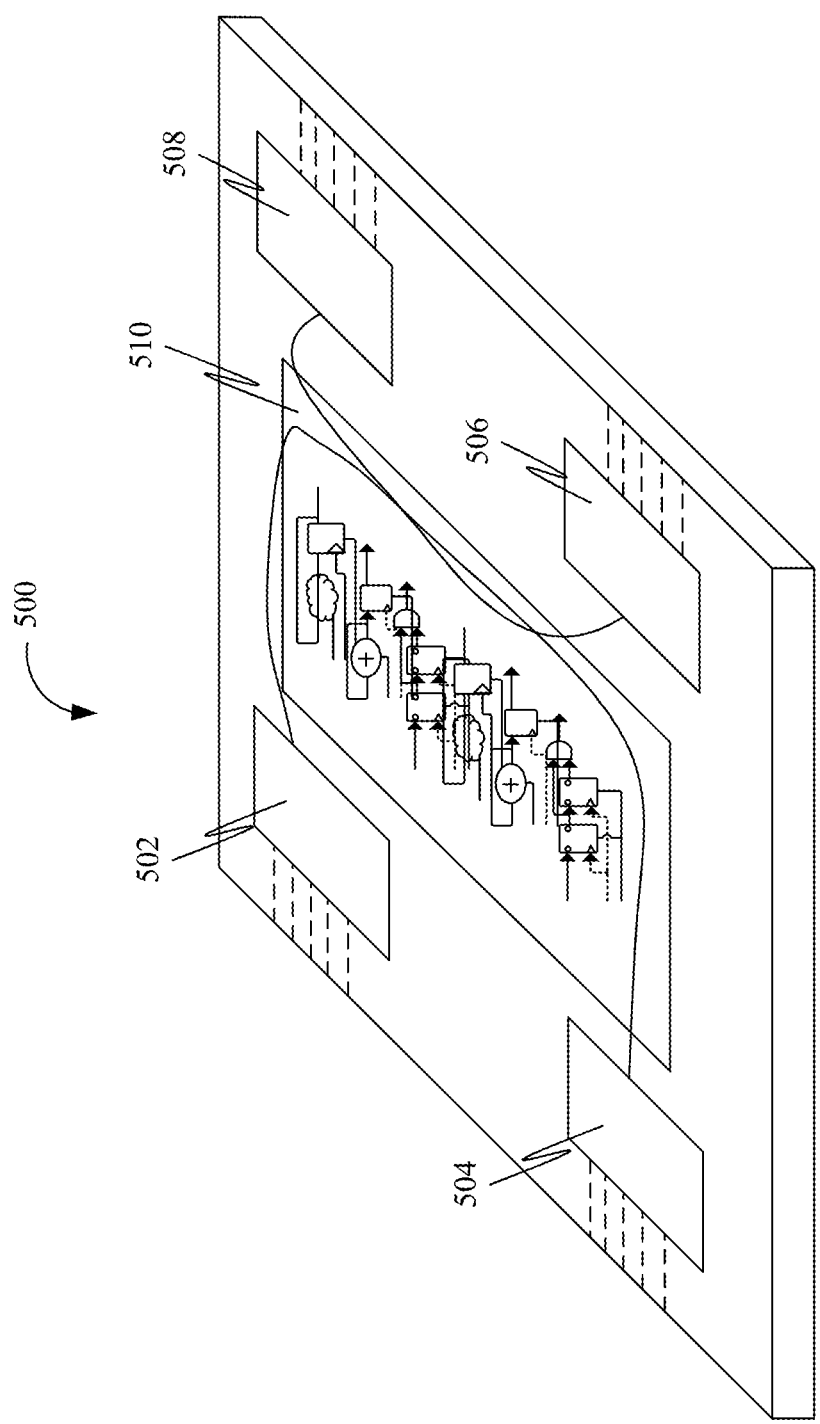
FIG. 5 is a schematic representation of a flat design architecture of a programmable logic device (PLD), in accordance with some embodiments.
Figure 6:
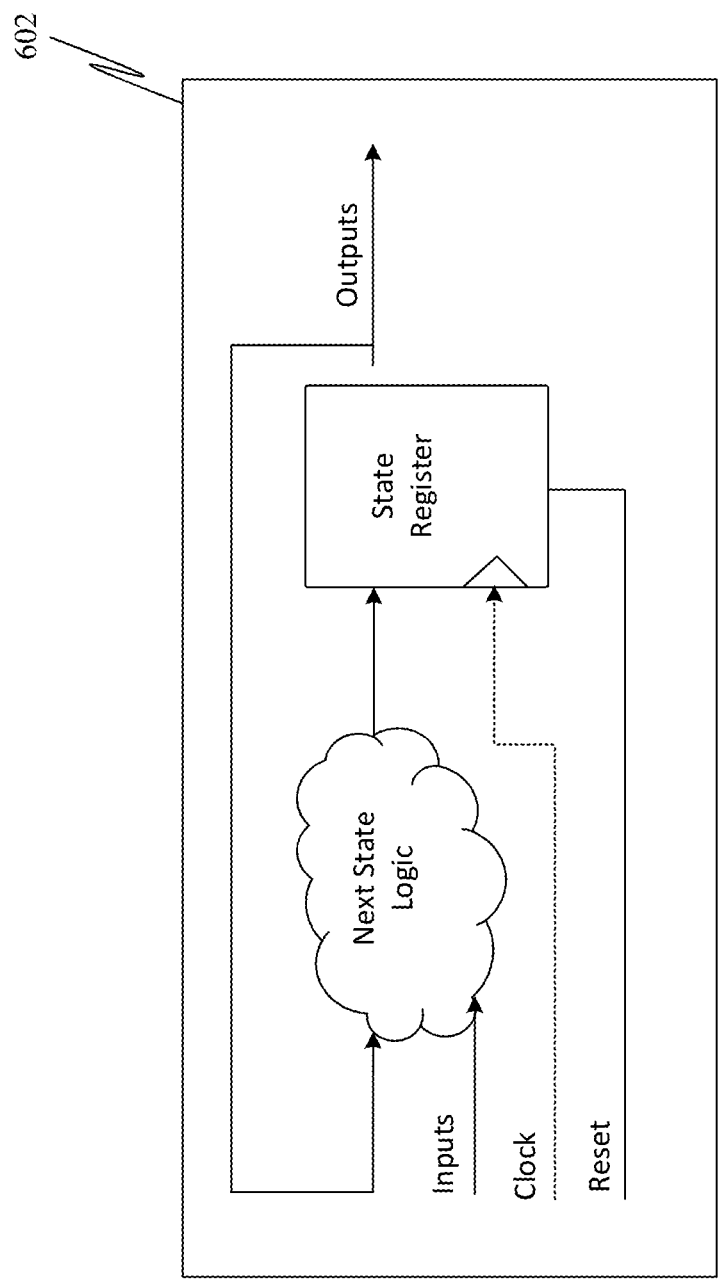
FIG. 6 is a schematic representation of the state machine of the framework module, in accordance with some embodiments.
Figure 7:
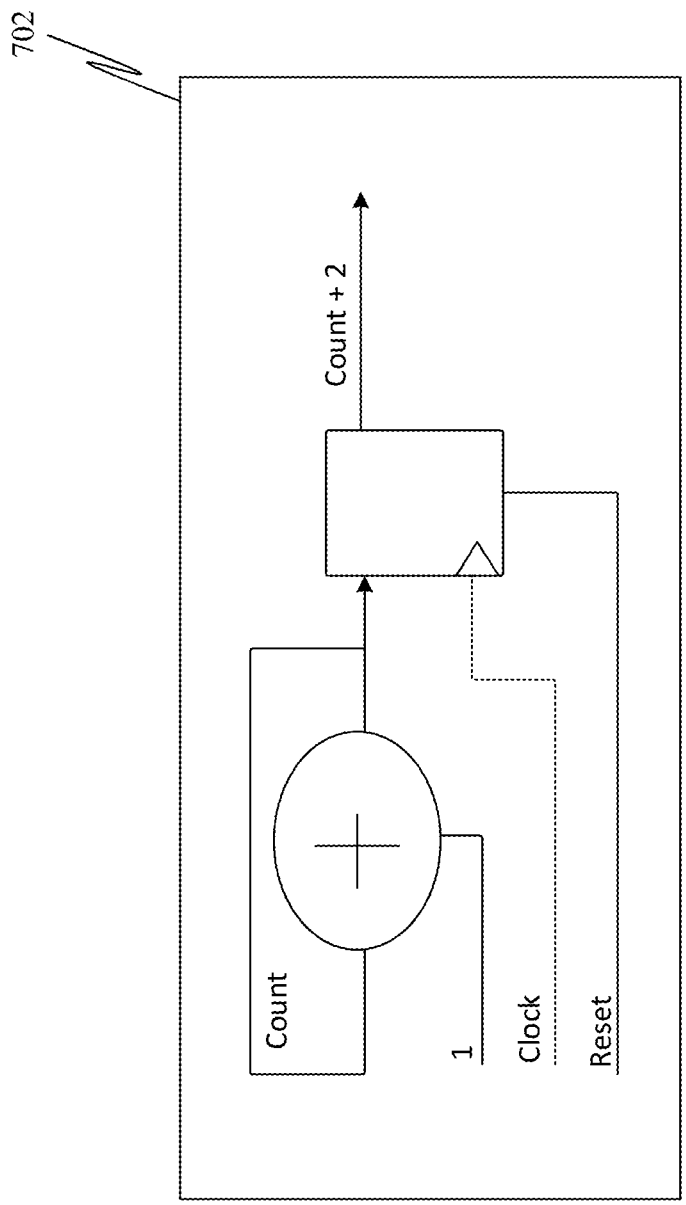
FIG. 7 is a schematic representation of the counter circuit of the framework module, in accordance with some embodiments.
Figure 8:
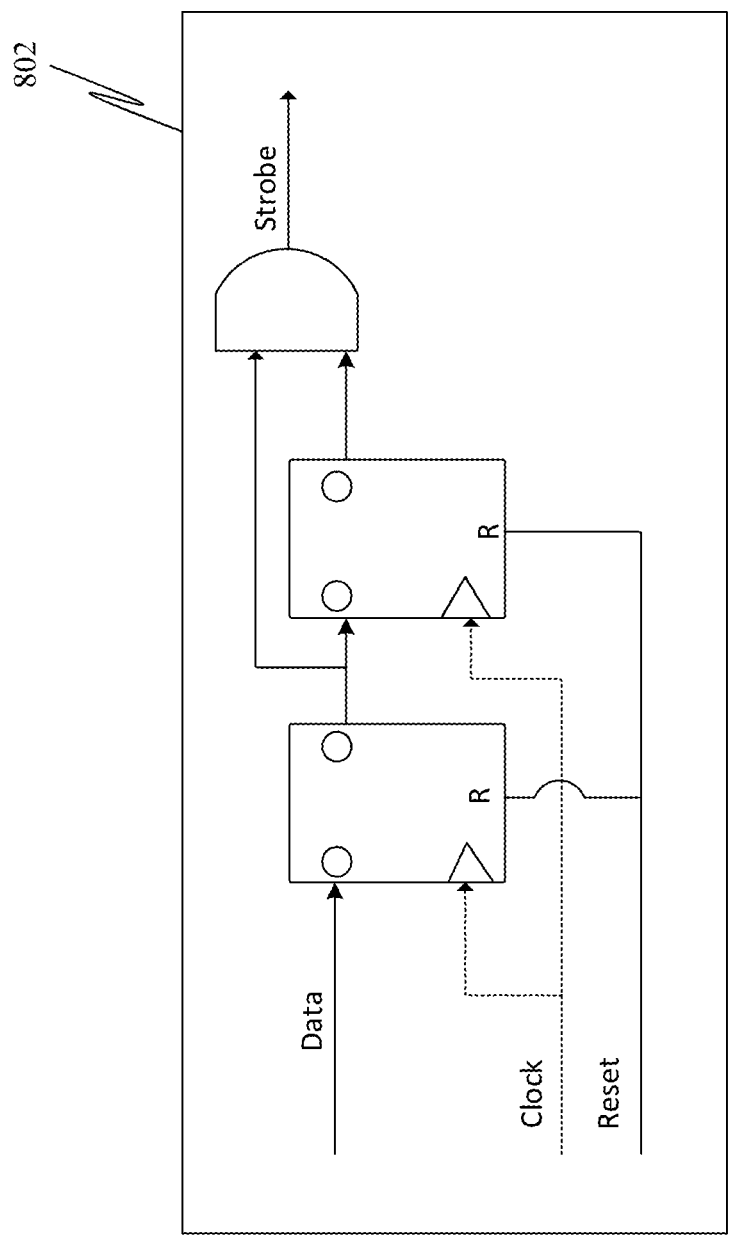
FIG. 8 is a schematic representation of the edge detection circuit of the framework module, in accordance with some embodiments.
Figure 9:
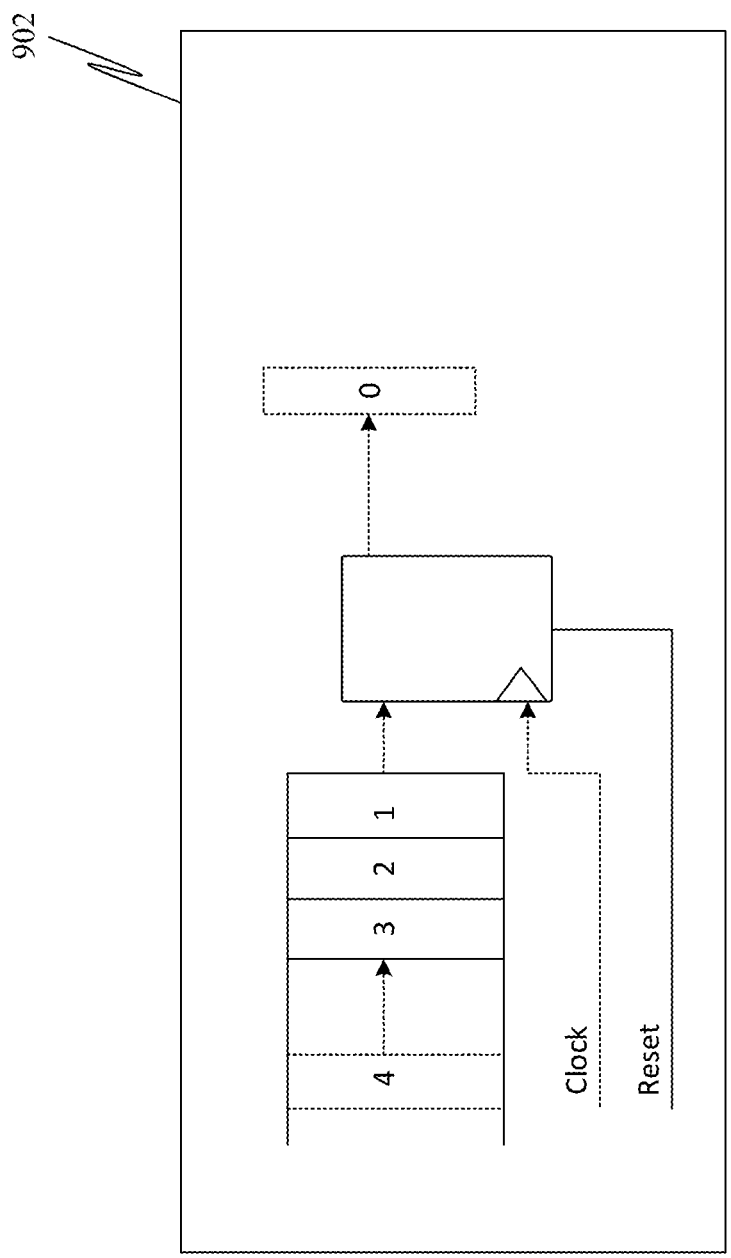
FIG. 9 is a schematic representation of the FIFO of the framework module, in accordance with some embodiments.

FIG. 5 is a schematic representation of a flat design architecture of a programmable logic device (PLD) 500, in accordance with some embodiments. Further, the flat design architecture of the PLD 500 may include a plurality of modules 502-508 and a framework module 510. Further, the framework module 510 may include synchronous logic, an inter-connect framework, an interconnection infrastructure. Further, the plurality of modules 502-508 may be associated with a common interface. Further, the synchronous logic may include at least one synchronous logic component. Further, the synchronous logic component may include a state machine 602 (as shown in FIG. 6), a counter circuit 702 (as shown in FIG. 7), an edge detection circuit 802 (as shown in FIG. 8), etc. Further, the state machine 602 may be associated with a state register. Further, the interconnection infrastructure may be associated with an independent or loosely coupled data path and control path interconnection. Further, the data path may be associated with a data path crossbar. Further, the data path crossbar may include a register, a FIFO 902 (as shown in FIG. 9), a memory block, etc. Further, the control path may be associated with a control path crossbar. Further, the control path crossbar may include the register, the FIFO 902, the memory block, etc. Further, the at least one interface may be associated with input signals, output signals, and inout signals.

FIG. 6 is a schematic representation of the state machine 602 of the framework module 510, in accordance with some embodiments.

FIG. 7 is a schematic representation of the counter circuit 702 of the framework module 510, in accordance with some embodiments.

FIG. 8 is a schematic representation of the edge detection circuit 802 of the framework module 510, in accordance with some embodiments.

FIG. 9 is a schematic representation of the FIFO 902 of the framework module 510, in accordance with some embodiments.

Figure 10:
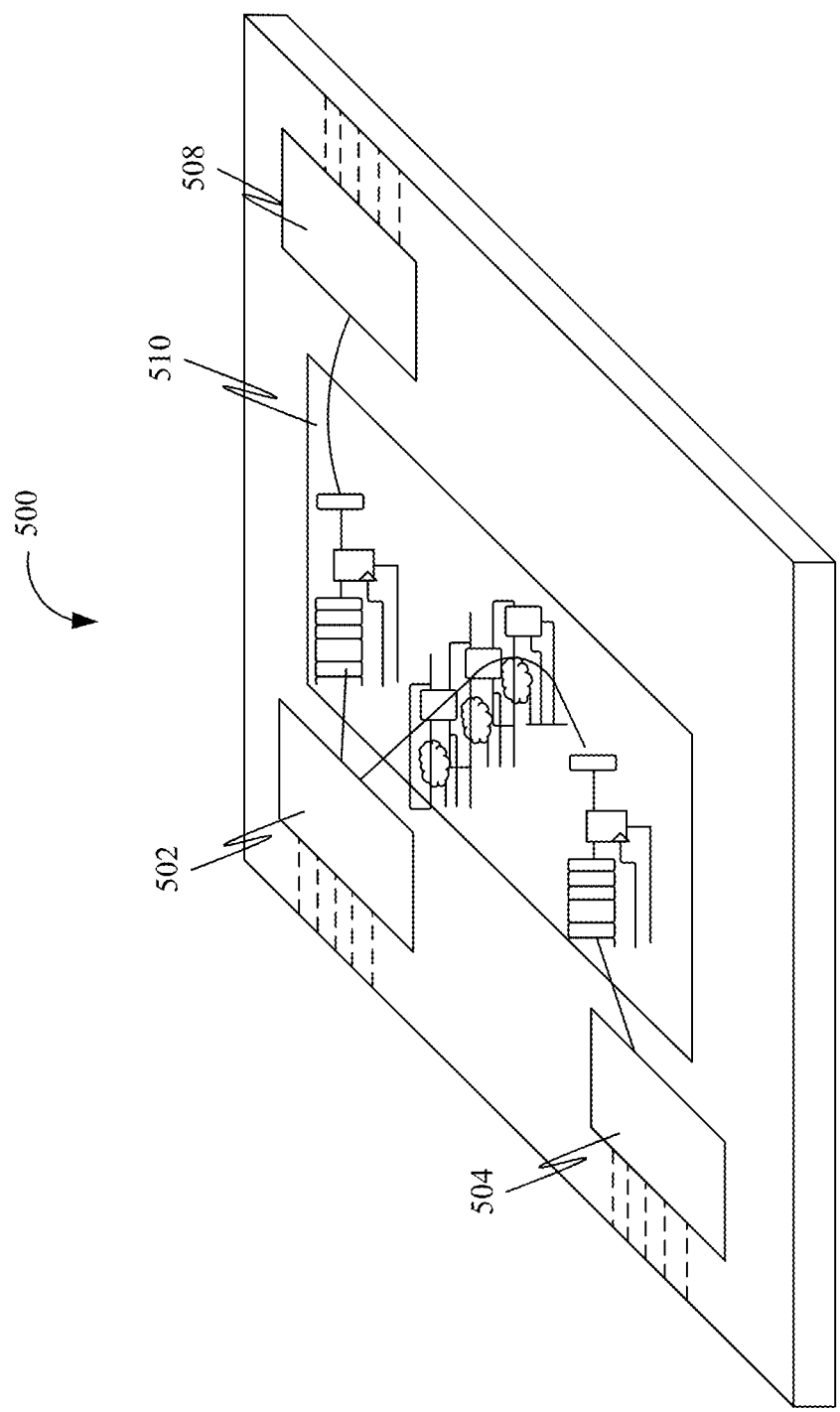
FIG. 10 is a schematic representation of a flat framework chain configuration of the flat design architecture of the programmable logic device (PLD), in accordance with some embodiments.

FIG. 10 is a schematic representation of a flat framework chain configuration of the flat design architecture of the programmable logic device (PLD) 500, in accordance with some embodiments.

Figure 11:
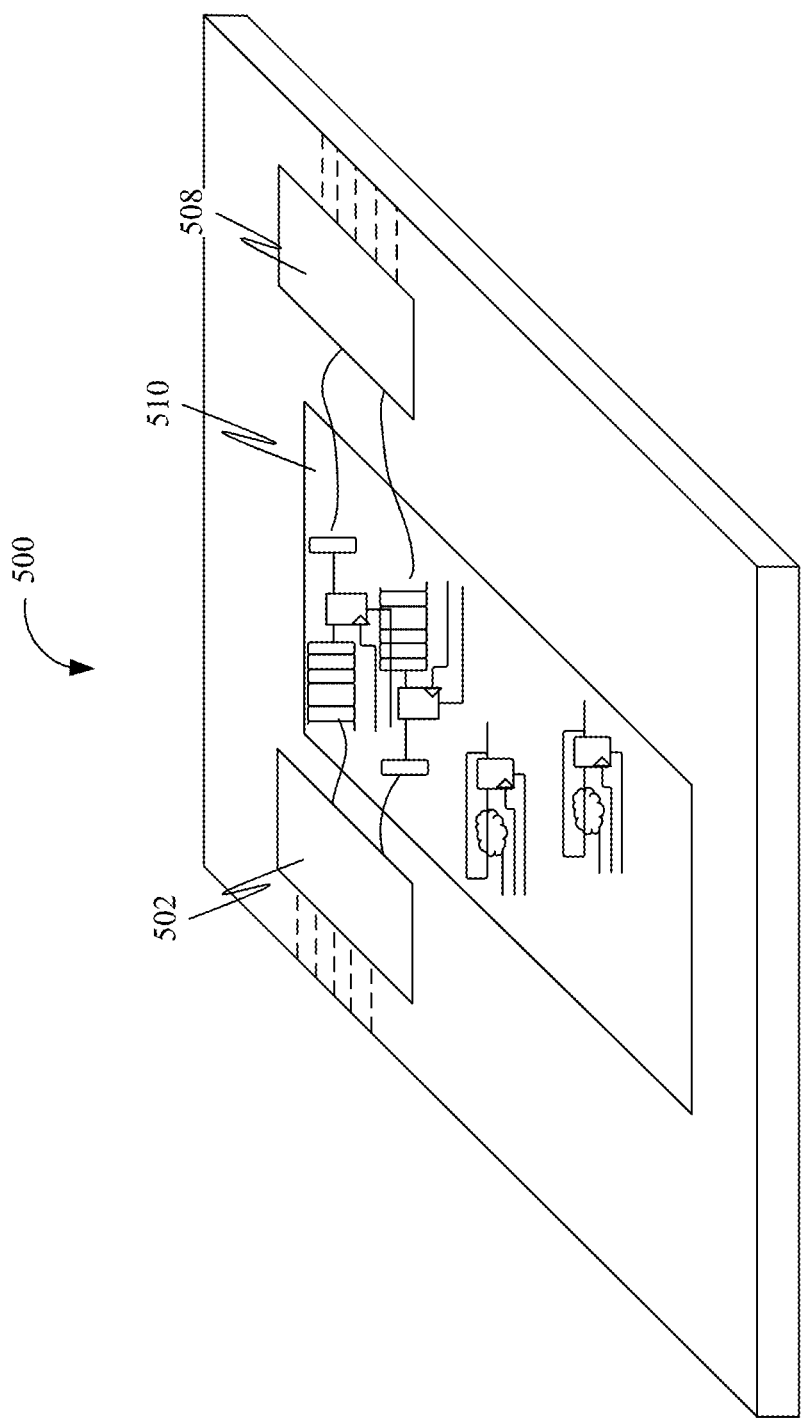
FIG. 11 is a schematic representation of a flat framework peer to peer configuration of the flat design architecture of the programmable logic device (PLD), in accordance with some embodiments.

FIG. 11 is a schematic representation of a flat framework peer to peer configuration of the flat design architecture of the programmable logic device (PLD) 500, in accordance with some embodiments.

Figure 12:
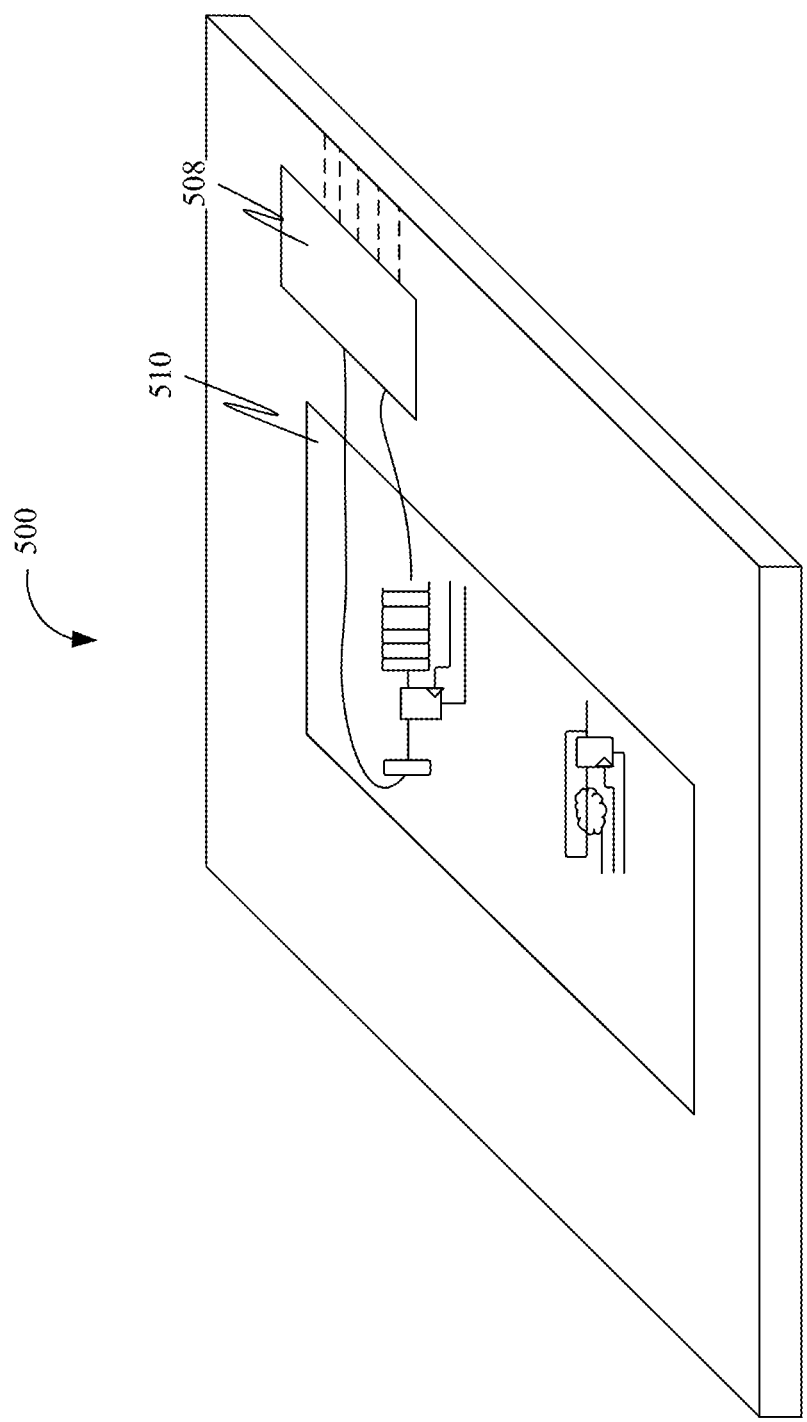
FIG. 12 is a schematic representation of a flat framework self-loop back configuration of the flat design architecture of the programmable logic device (PLD), in accordance with some embodiments.

FIG. 12 is a schematic representation of a flat framework self-loop back configuration of the flat design architecture of the programmable logic device (PLD) 500, in accordance with some embodiments.

Figure 13:
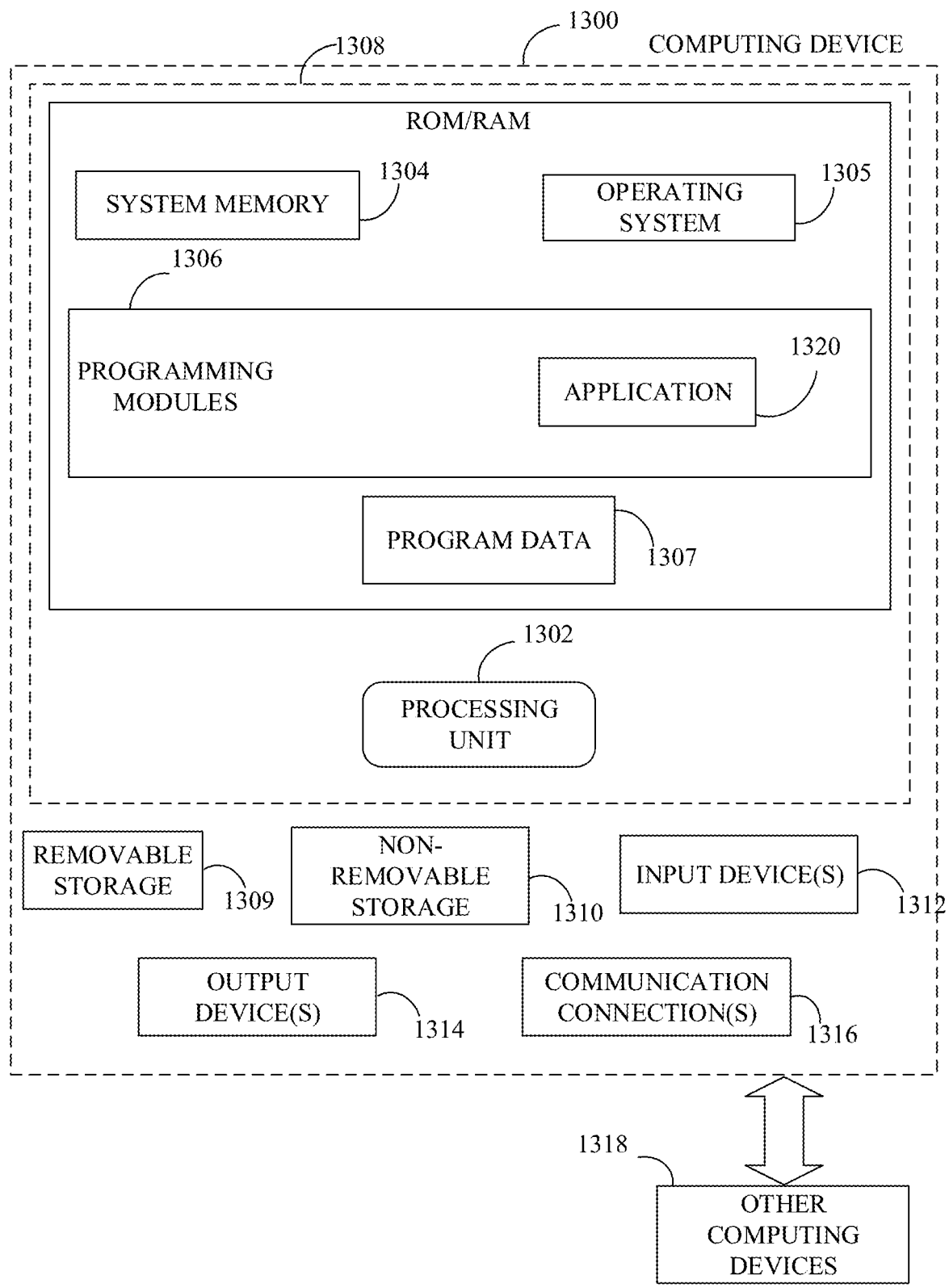
FIG. 13 is a block diagram of a computing device for implementing the methods disclosed herein, in accordance with some embodiments.

With reference to FIG. 13, a system consistent with an embodiment of the disclosure may include a computing device or cloud service, such as computing device 1300. In a basic configuration, computing device 1300 may include at least one processing unit 1302 and a system memory 1304. Depending on the configuration and type of computing device, system memory 1304 may comprise, but is not limited to, volatile (e.g. random-access memory (RAM)), non-volatile (e.g. read-only memory (ROM)), flash memory, or any combination. System memory 1304 may include operating system 1305, one or more programming modules 1306, and may include a program data 1307. Operating system 1305, for example, may be suitable for controlling computing device 1300's operation. Furthermore, embodiments of the disclosure may be practiced in conjunction with a graphics library, other operating systems, or any other application program and is not limited to any particular application or system. This basic configuration is illustrated in FIG. 13 by those components within a dashed line 1308.

Computing device 1300 may have additional features or functionality. For example, computing device 1300 may also include additional data storage devices (removable and/or non-removable) such as, for example, magnetic disks, optical disks, or tape. Such additional storage is illustrated in FIG. 13 by a removable storage 1309 and a non-removable storage 1310. Computer storage media may include volatile and non-volatile, removable and non-removable media implemented in any method or technology for storage of information, such as computer-readable instructions, data structures, program modules, or other data. System memory 1304, removable storage 1309, and non-removable storage 1310 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1300. Any such computer storage media may be part of device 1300. Computing device 1300 may also have input device(s) 1312 such as a keyboard, a mouse, a pen, a sound input device, a touch input device, a location sensor, a camera, a biometric sensor, etc. Output device(s) 1314 such as a display, speakers, a printer, etc. may also be included. The aforementioned devices are examples and others may be used.

Computing device 1300 may also contain a communication connection 1316 that may allow device 1300 to communicate with other computing devices 1318, such as over a network in a distributed computing environment, for example, an intranet or the Internet. Communication connection 1316 is one example of communication media. Communication media may typically be embodied by computer-readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer-readable media as used herein may include both storage media and communication media.

As stated above, a number of program modules and data files may be stored in system memory 1304, including operating system 1305. While executing on processing unit 1302, programming modules 1306 may perform processes including, for example, one or more stages of methods, algorithms, systems, applications, servers, databases as described above. The aforementioned process is an example, and processing unit 1302 may perform other processes. Other programming modules that may be used in accordance with embodiments of the present disclosure may include machine learning applications.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general-purpose graphics processor-based systems, multiprocessor systems, microprocessor-based or programmable consumer electronics, application-specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer-readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid-state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

FIG. 14 is an illustration of a code for facilitating instantiation of common components and a framework module, in accordance with some embodiments.

FIG. 15 is an illustration of a code of a port interface of an application module, in accordance with some embodiments.

FIG. 16 is an illustration of a code of an application module, in accordance with some embodiments.

FIG. 17 is an illustration of a code of the application module, in accordance with some embodiments.

Figure 18:
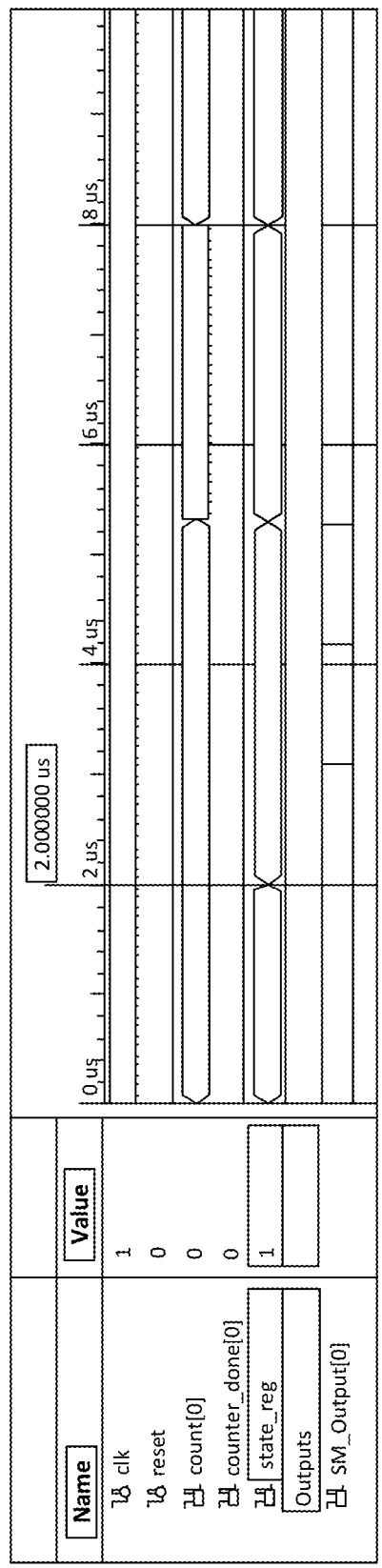
FIG. 18 is an illustration of a simulation of the code of the application module, in accordance with some embodiments.

FIG. 18 is an illustration of a simulation of the code of the application module, in accordance with some embodiments.

FIG. 19 is an illustration of a traditional hierarchal architecture of a programmable logic device (PLD) 1900. Further, the traditional hierarchal architecture of the PLD 1900 may include a plurality of hierarchal modules 1902-1908. Further, the plurality of hierarchal modules 1902-1908 may include a plurality of synchronous logic components 1910. Further, the plurality of hierarchal modules 1902-1908 may be connected using a wired interconnection 1912. Further, the plurality of hierarchal modules 1902-1908 may be associated with a plurality of I/O signals 1914-1916.

FIG. 20 is an illustration of a novel flat architecture of a programmable logic device (PLD) 2000, in accordance with some embodiments. Further, the novel flat architecture of the PLD 2000 may include a plurality of application modules 2002-2008 and at least one framework module 2010. Further, the at least one framework module 2010 may include a plurality of synchronous components 2014-2018 and a logical interconnection 2012. Further, the plurality of application modules 2002-2008 may be associated with a plurality of I/O signals 2020-2022.

FIG. 21 is a schematic representation of a system 2100 for facilitating loop testing of the PLD 2000, in accordance with some embodiments. Further, the system 2100 may include an oscilloscope 2104, a computing device 2102, and the PLD 2000. Further, the computing device 2102 may include a host PC (personal computer), an embedded CPU (central processing unit), etc. Further, the at least one framework module 2010 of the PLD 2000 may implement a control signal interface that may be utilized by the host PC or the embedded CPU. Further, the host PC or the embedded CPU may indirectly interface with any of at least one application module of the plurality of application modules 2002-2008 of the PLD 2000 through the use of the logical interconnection 2012 provided by the at least one framework module 2010. Further, the host PC or the embedded CPU may facilitate in-circuit testing and visualization of at least one state machine data-path.

FIG. 22 is an illustration of the novel flat architecture of the programmable logic device (PLD) 2000 without the at least one framework module 2010, in accordance with some embodiments. Further, the plurality of I/O signals 2020-2022 may be destined for a plurality of pins of the PLD 2000. Further, the PLD 2000 may be a FPGA (Field Programmable Gate Array).

FIG. 23 is an illustration of the novel flat architecture of the programmable logic device (PLD) 2000, in accordance with some embodiments. Further, the at least one framework module 2010 may be associated with at least one clock domain 2304 and a reset signal 2302. Further, the at least one framework module 2010 may be operating on the at least one clock domain 2304 and sharing the reset signal 2302 with at least one application module of the plurality of application modules 2002-2008.

FIG. 24 is an illustration of the novel flat architecture of the programmable logic device (PLD) 2000, in accordance with some embodiments. Further, the at least one framework module may include a first framework module 2402 and a second framework module 2404. Further, the first framework module 2402 may be associated with a first clock domain 2406 and the second framework module 2404 may be associated with a second clock domain 2406.

Figure 25:
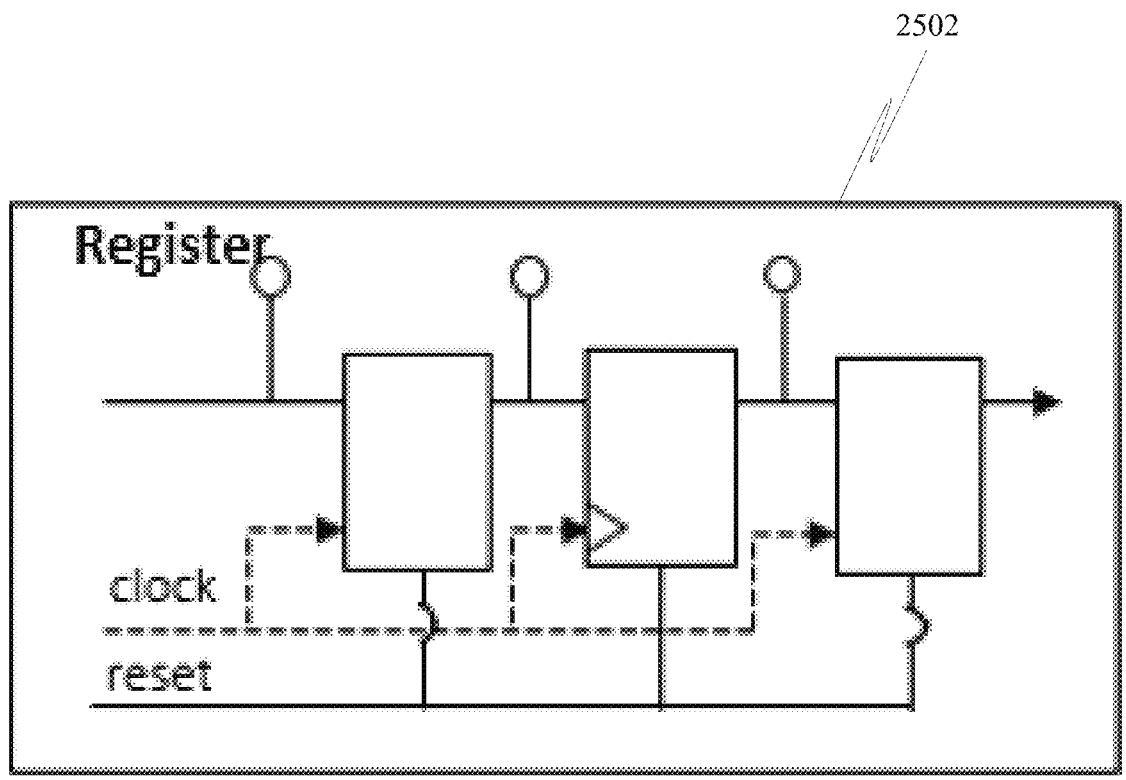
FIG. 25 is a schematic representation of a register, in accordance with some embodiments.

FIG. 25 is a schematic representation of a register 2502, in accordance with some embodiments.

FIG. 26 is an illustration of a code of a fixed port interface of an application module, in accordance with some embodiments.

FIG. 27 is an illustration of a code of an API (application programming interface) call, in accordance with some embodiments. Further, a logical connection between a plurality of application modules may be made through at least one framework module by the use of the API procedure call and may pass a constant integer value.

FIG. 28 is an illustration of a code of the API (application programming interface) call, in accordance with some embodiments.

FIG. 29 is an illustration of a code of a package file, in accordance with some embodiments. Further, the package file may include an implementation of at least one framework module. Further, the package file may include an implementation of at least one API (application programming interface) calls.

FIG. 30 is an illustration of a code of an API (application programming interface) call, in accordance with some embodiments.

Although the present disclosure has been explained in relation to its preferred embodiment, it is to be understood that many other possible modifications and variations can be made without departing from the spirit and scope of the disclosure.

The following is claimed:

1. A method of designing a programmable logic device (PLD), the method comprising:
    transmitting, using a communication device, a plurality of module indications corresponding to a plurality of application modules to a client device;
    receiving, using the communication device, a Hardware Description Language (HDL) code expressing a design of the PLD from the client device, wherein the HDL code is based on a non-hierarchical architecture comprising a framework module and a plurality of application modules, wherein the HDL code comprises at least one Application Programming Interface (API) call corresponding to at least one application module of the plurality of application modules, wherein the at least one API call comprises at least one module indication of the plurality of module indications, wherein each application module of the plurality of application modules comprises a standard port interface, wherein the framework module comprises a plurality of common synchronous logic components shared by the plurality of application modules through the standard port interface and an interconnect infrastructure configured to interconnect the plurality of application modules;
    analyzing, using a processing device, the HDL code;
    retrieving, using a storage device, the at least one application module and the framework module corresponding to the at least one API call based on the analyzing of the HDL code;
    instantiating, using the processing device, the framework module and the at least one application module based on the retrieving;
    configuring, using the processing device, each of the plurality of common synchronous logic components and the interconnect infrastructure based on the at least one API call;
    generating, using the processing device, a flat framework circuit data corresponding to the PLD based on the instantiating and the configuring; and
    transmitting, using the communication device, the flat framework circuit data to the client device.

2. The method of designing a PLD of claim 1, wherein the plurality of common synchronous logic components is configured by the plurality of application modules through the standard port interface.

3. The method of designing a PLD of claim 1, wherein the plurality of common synchronous logic components is configured by the plurality of application modules using a low-level signal call comprised in the HDL code.

4. The method of designing a PLD of claim 1, wherein a first application module of the plurality of application modules is configured to communicate with a second application module of the plurality of application modules based on the standard port interface through the at least one API call.

5. The method of designing a PLD of claim 1, wherein each application module of the plurality of application modules is configured to handle off-chip Input/Output (TO) signals based on low-level signal assignments comprised in the HDL code.

6. The method of designing a PLD of claim 1, wherein each application module of the plurality of application modules is configured to directly access a top-level system port associated with the PLD.

7. The method of designing a PLD of claim 1, wherein the standard port interface comprises an output signal interface and an input signal interface, wherein the output signal interface is configured to be routed to the framework module for parameterization of a next state logic function, wherein the input signal interface is configured to return a state registered logic from the framework module.

8. The method of designing a PLD of claim 1, wherein the plurality of common synchronous logic components comprises an array of state machines.

9. The method of designing a PLD of claim 1, wherein the framework module comprises a first array of records of next state logic corresponding to an input to the framework module and a second array of records of state registered logic corresponding to an output of the framework module, wherein an application module of the plurality of application modules is associated with an index corresponding to the array of state machines.

10. The method of designing a PLD of claim 1, wherein the plurality of common synchronous logic components comprises at least one of a state machine, a counter circuit, and an edge detection circuit.

11. The method of designing a PLD of claim 1, wherein the framework module comprises a plurality of framework modules, wherein the plurality of framework modules operates on a plurality of clock domains with the plurality of application modules.

* * * * *